United States Patent
Kim et al.

(10) Patent No.: US 12,125,791 B2
(45) Date of Patent: Oct. 22, 2024

(54) SEMICONDUCTOR DEVICES AND ELECTRONIC SYSTEMS INCLUDING THE SAME

(71) Applicant: Samsung Electronics Co., Ltd., Suwon-si (KR)

(72) Inventors: Jeeyong Kim, Hwaseong-si (KR); Junghwan Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 266 days.

(21) Appl. No.: 17/209,657

(22) Filed: Mar. 23, 2021

(65) Prior Publication Data

US 2022/0051983 A1    Feb. 17, 2022

(30) Foreign Application Priority Data

Aug. 12, 2020    (KR) .................. 10-2020-0101398

(51) Int. Cl.
*H01L 23/535*    (2006.01)
*H01L 21/768*    (2006.01)
(Continued)

(52) U.S. Cl.
CPC ...... *H01L 23/535* (2013.01); *H01L 21/76805* (2013.01); *H01L 21/76889* (2013.01);
(Continued)

(58) Field of Classification Search
CPC ............ H01L 23/535; H01L 21/76805; H01L 21/76889; H01L 21/76895; H01L 23/5226;
(Continued)

(56) References Cited

U.S. PATENT DOCUMENTS 9,425,208 B2    8/2016    Kim et al.
9,978,756 B2    5/2018    Kim et al.
(Continued)

FOREIGN PATENT DOCUMENTS

KR    100688563 B1    3/2007

OTHER PUBLICATIONS

"Extended European Search Report for European Application No. 21174974.2, dated Mar. 15, 2022, 10 pages".

*Primary Examiner* — Jay C Kim
*Assistant Examiner* — Woo K Lee
(74) *Attorney, Agent, or Firm* — Myers Bigel, P.A.

(57) ABSTRACT

A semiconductor device includes: a substrate including a memory cell region and a connection region; a plurality of gate lines vertically overlapping each other in the memory cell region of the substrate in a vertical direction, each gate line including a first metal; a stepped connection unit in the connection region and comprising a plurality of conductive pad regions, each conductive pad region including the first metal and integrally connected to a respective gate line of the plurality of gate lines; a plurality of contact structures vertically overlapping the stepped connection unit, each contact structure connected to a respectively corresponding conductive pad region of the plurality of conductive pad regions and including a second metal; and at least one metal silicide layer between at least one contact structure and the respectively corresponding conductive pad region.

12 Claims, 34 Drawing Sheets

(51) Int. Cl.

|  |  |
|---|---|
| *H01L 23/522* | (2006.01) |
| *H01L 23/528* | (2006.01) |
| *H10B 41/27* | (2023.01) |
| *H10B 41/41* | (2023.01) |
| *H10B 43/27* | (2023.01) |
| *H10B 43/40* | (2023.01) |

(52) U.S. Cl.
CPC .... *H01L 21/76895* (2013.01); *H01L 23/5226* (2013.01); *H01L 23/5283* (2013.01); *H10B 41/27* (2023.02); *H10B 41/41* (2023.02); *H10B 43/27* (2023.02); *H10B 43/40* (2023.02)

(58) Field of Classification Search
CPC ..... H01L 23/5283; H10B 41/27; H10B 41/41; H10B 43/27; H10B 43/40
See application file for complete search history.

(56) References Cited

U.S. PATENT DOCUMENTS

| 10,553,605 B2 | 2/2020 | Gu et al. |
| 2010/0320526 A1 | 12/2010 | Kidoh et al. |
| 2013/0056818 A1* | 3/2013 | Iino ........................ H10B 43/35 |
| | | 257/E21.09 |
| 2016/0027796 A1 | 1/2016 | Yang et al. |
| 2018/0269214 A1 | 9/2018 | Jiang et al. |
| 2020/0043943 A1* | 2/2020 | Kang ..................... H10B 43/40 |
| 2020/0096994 A1* | 3/2020 | Cella ................ G05B 19/41845 |
| 2021/0066394 A1* | 3/2021 | Conti ..................... H10B 63/80 |

\* cited by examiner

SEMICONDUCTOR DEVICES AND ELECTRONIC SYSTEMS INCLUDING THE SAME

CROSS-REFERENCE TO RELATED APPLICATION

This application is based on and claims priority under 35 U.S.C. § 119 to Korean Patent Application No. 10-2020-0101398, filed on Aug. 12, 2020, in the Korean Intellectual Property Office, the disclosure of which is incorporated by reference herein in its entirety.

TECHNICAL FIELD

Aspects of the present disclosure relate to a semiconductor device and an electronic system including the same, and more particularly, to a semiconductor device including a non-volatile vertical-type memory element and an electronic system including the same.

BACKGROUND

A semiconductor device that can store a large amount of data in an electronic system is increasingly desirable. Methods and techniques have been studied to increase the data storage capacity of semiconductor devices. For example, one proposed technique to increase the data storage capacity of a semiconductor device is to include a vertical memory element that includes three-dimensionally arranged memory cells instead of two-dimensionally arranged memory cells has been proposed.

SUMMARY

Some aspects of the present disclosure provide a semiconductor device that includes three-dimensionally arranged memory cells and that can maintain desirable electrical characteristics even as the number of layers of word lines for integration improvement is increased, and as the number of contacts and the number of wirings connected to the word line are increased.

Some aspects of the present disclosure provide an electronic system including a semiconductor device that includes three-dimensionally arranged memory cells and that can maintain desirable electrical characteristics even as the number of layers of word lines for integration improvement is increased, and as the number of contacts and the number of wirings connected to the word line are increased.

According to some aspect of the inventive concepts, there is provided a semiconductor device including: a substrate including a memory cell region and a connection region; a plurality of gate lines vertically overlapping each other in the memory cell region of the substrate, each gate line including a first metal; a stepped connection unit comprising a plurality of conductive pad regions, each conductive pad region integrally connected to a respective gate line of the plurality of gate lines and including the first metal; a plurality of contact structures vertically overlapping the stepped connection unit, each contact structure connected to a respectively corresponding conductive pad region of the plurality of conductive pad regions and including a second metal; and at least one metal silicide layer between at least one contact structure and the respectively corresponding conductive pad region.

According to some aspects of the inventive concepts, there is provided a semiconductor device including: a substrate including a memory cell region and a connection region; a gate stack including a first gate line integrally connected with a first conductive pad region, the first gate line extending in a horizontal direction parallel with a main surface of the substrate in the memory cell region and the first conductive pad region extending in the horizontal direction in the connection region, and the first gate line and conductive pad region including a first metal; a contact structure extending in the connection region in a vertical direction, the contact structure including a second metal; and a metal silicide layer between the first conductive pad region and the contact structure, the metal silicide layer contacting the first conductive pad region and the contact structure.

According to an aspect of the inventive concept, an electronic system includes: a main substrate; a semiconductor device on the main substrate; and a controller electrically connected to the semiconductor device on the main substrate, wherein the semiconductor device includes: a device substrate including a memory cell region and a connection region; a gate stack including a gate line integrally connected with a conductive pad region, the gate line extending in a horizontal direction parallel with a main surface of the substrate in the memory cell region of the substrate, and the conductive pad region extending in the connection region in the horizontal direction, and the gate line and the conductive pad region both including a first metal; a contact structure vertically extending in the connection region and including a second metal; a metal silicide layer between the conductive pad region and the contact structure; a periphery circuit region spaced apart from the gate stack; and an input/output pad on the device substrate.

BRIEF DESCRIPTION OF THE DRAWINGS

Some example embodiments of the inventive concepts will be more clearly understood from the following detailed description taken in conjunction with the accompanying drawings in which.

Figure 8A:
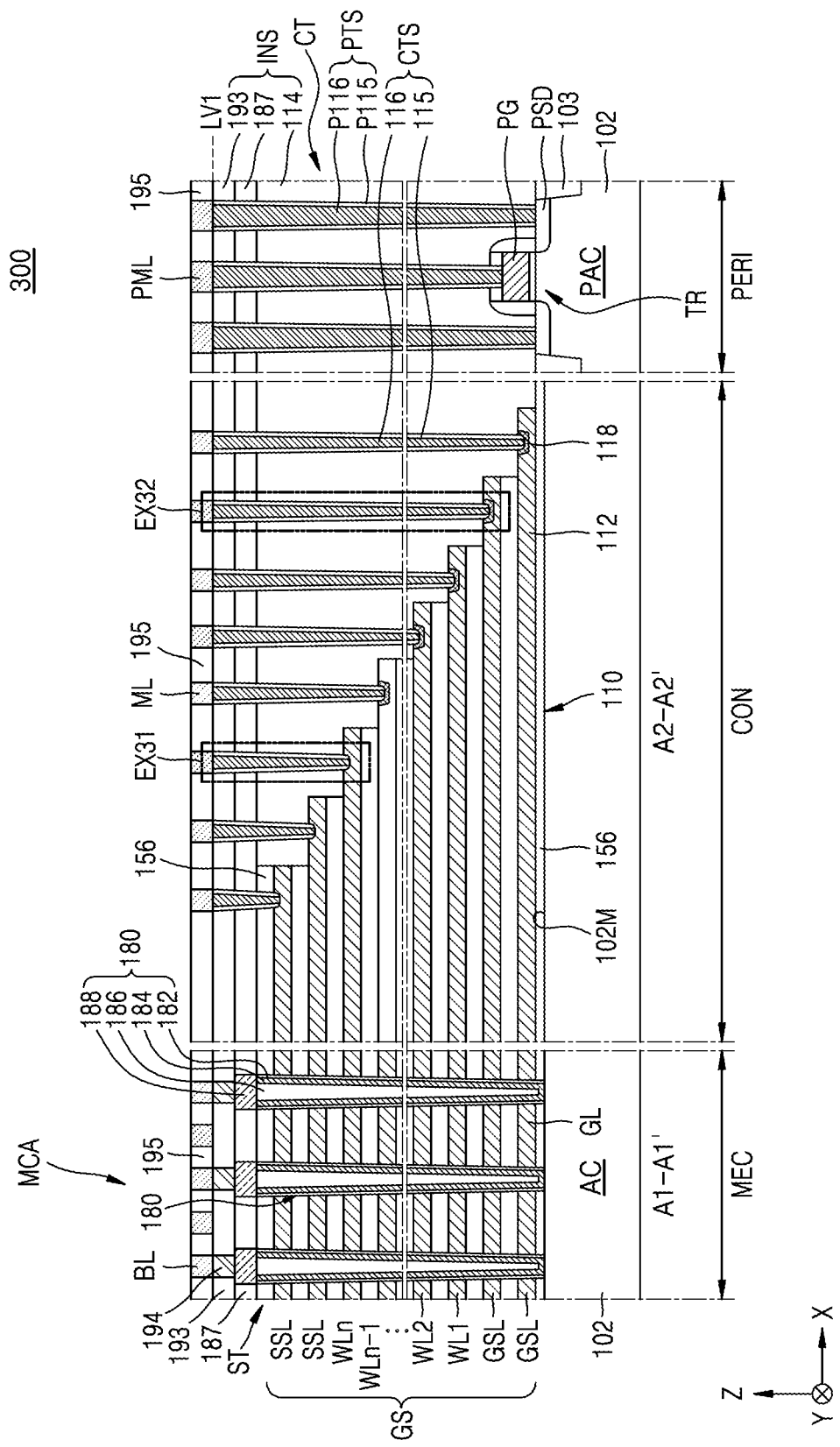
FIG. 8A illustrates cross-sectional views of modified examples of a semiconductor device, according to other embodiments of the inventive concept, (A) in FIG. 8B is an enlarged cross-sectional view of a local region EX31 in FIG.
Figure 8B:
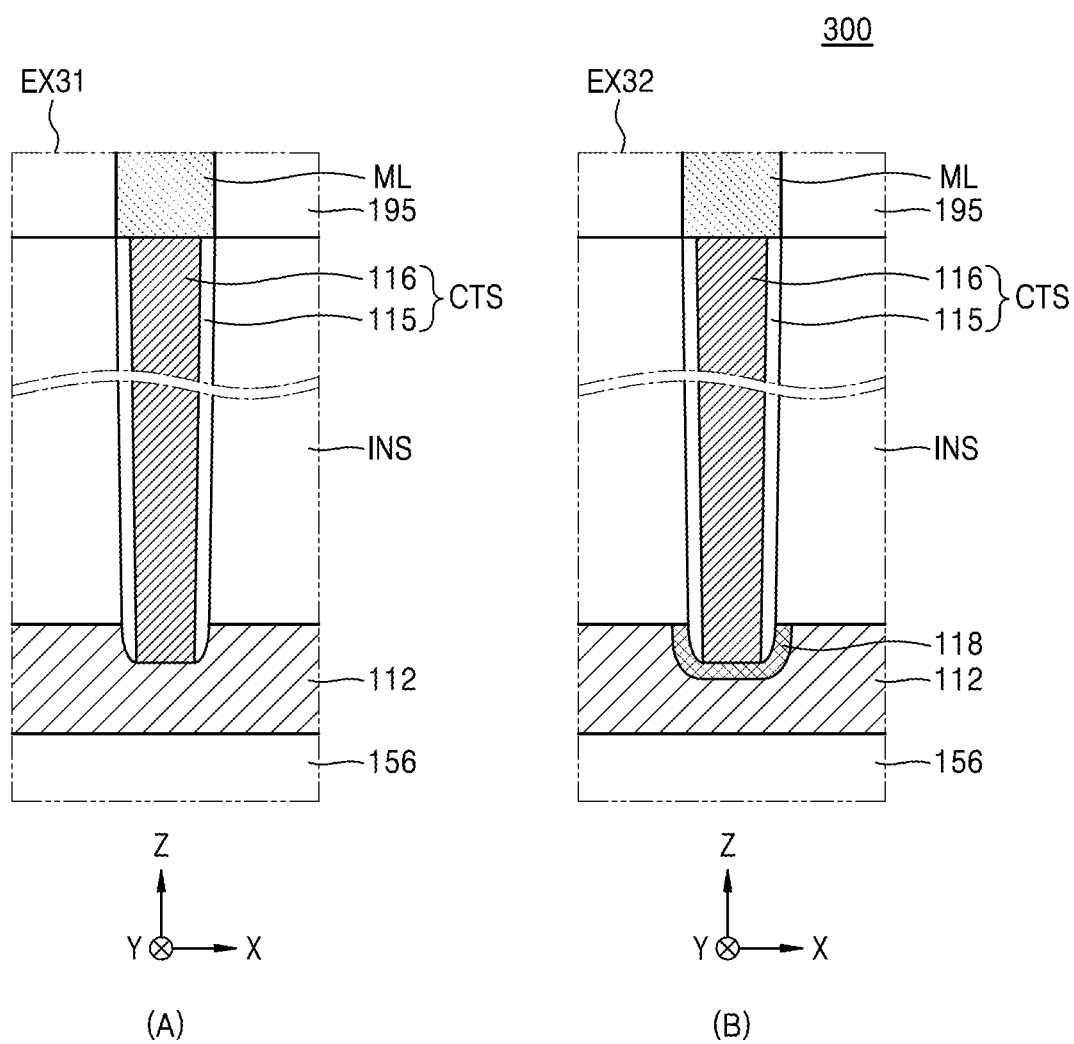
Figure 9:
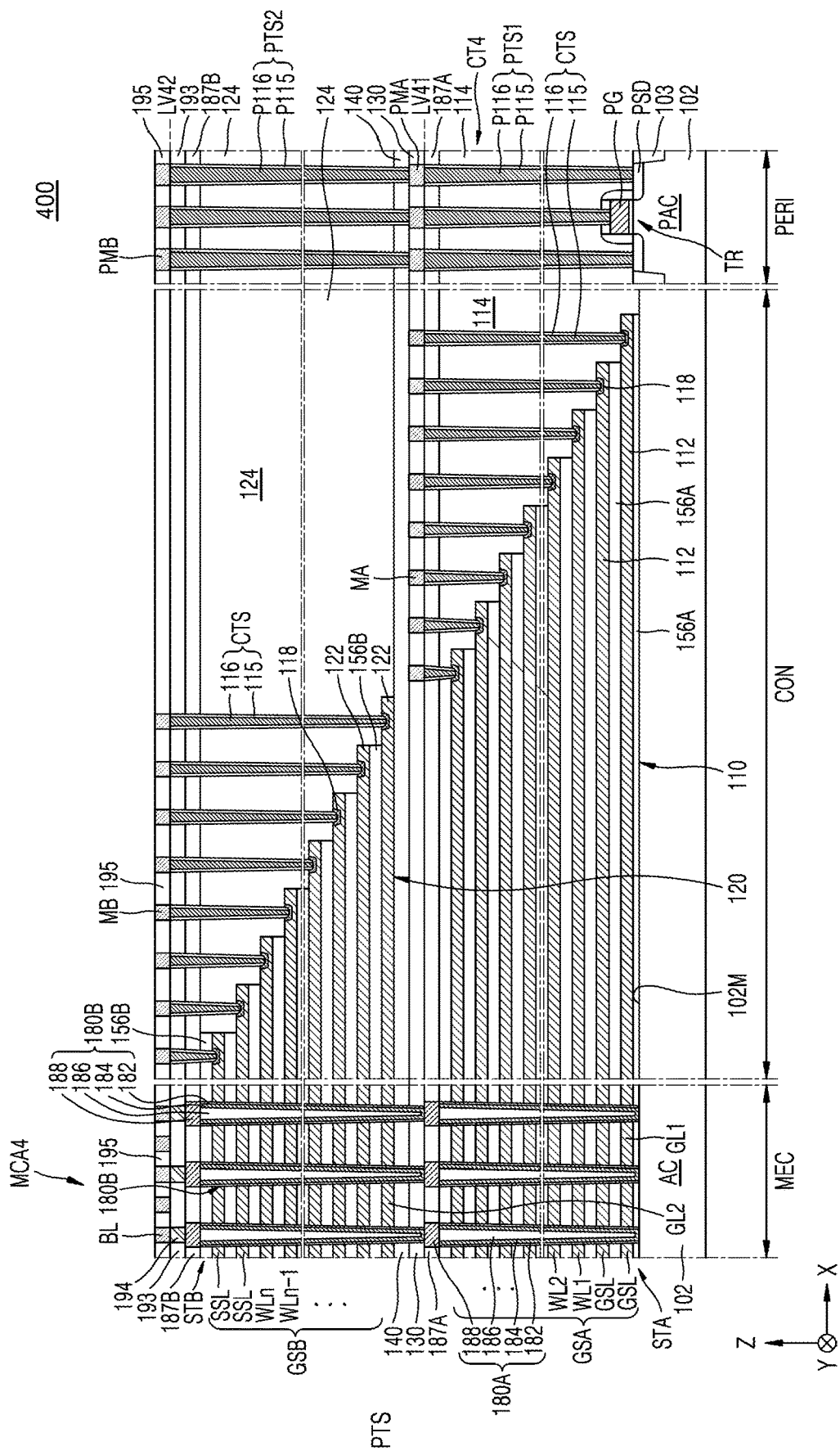
Figure 10:
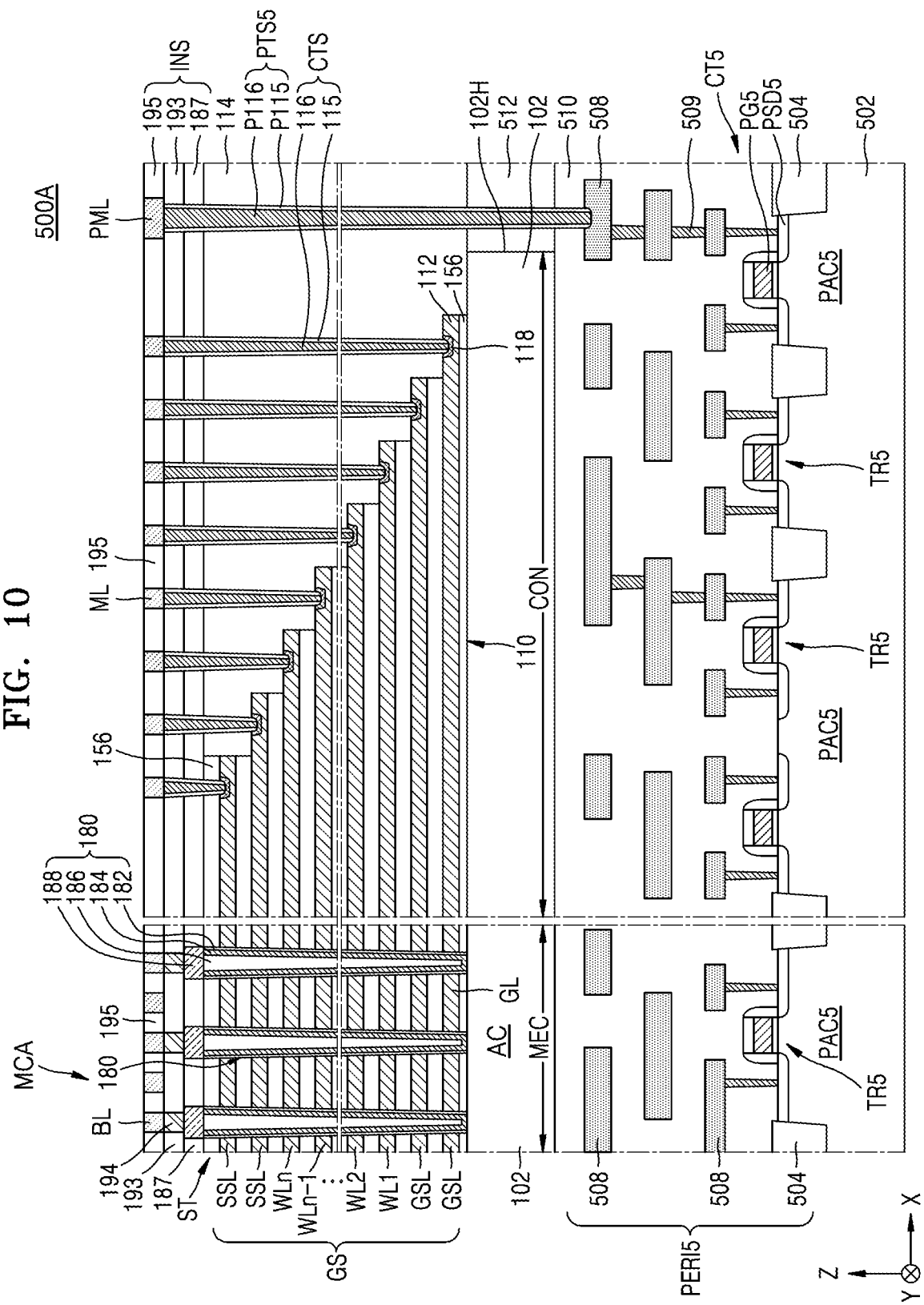
Figure 11:
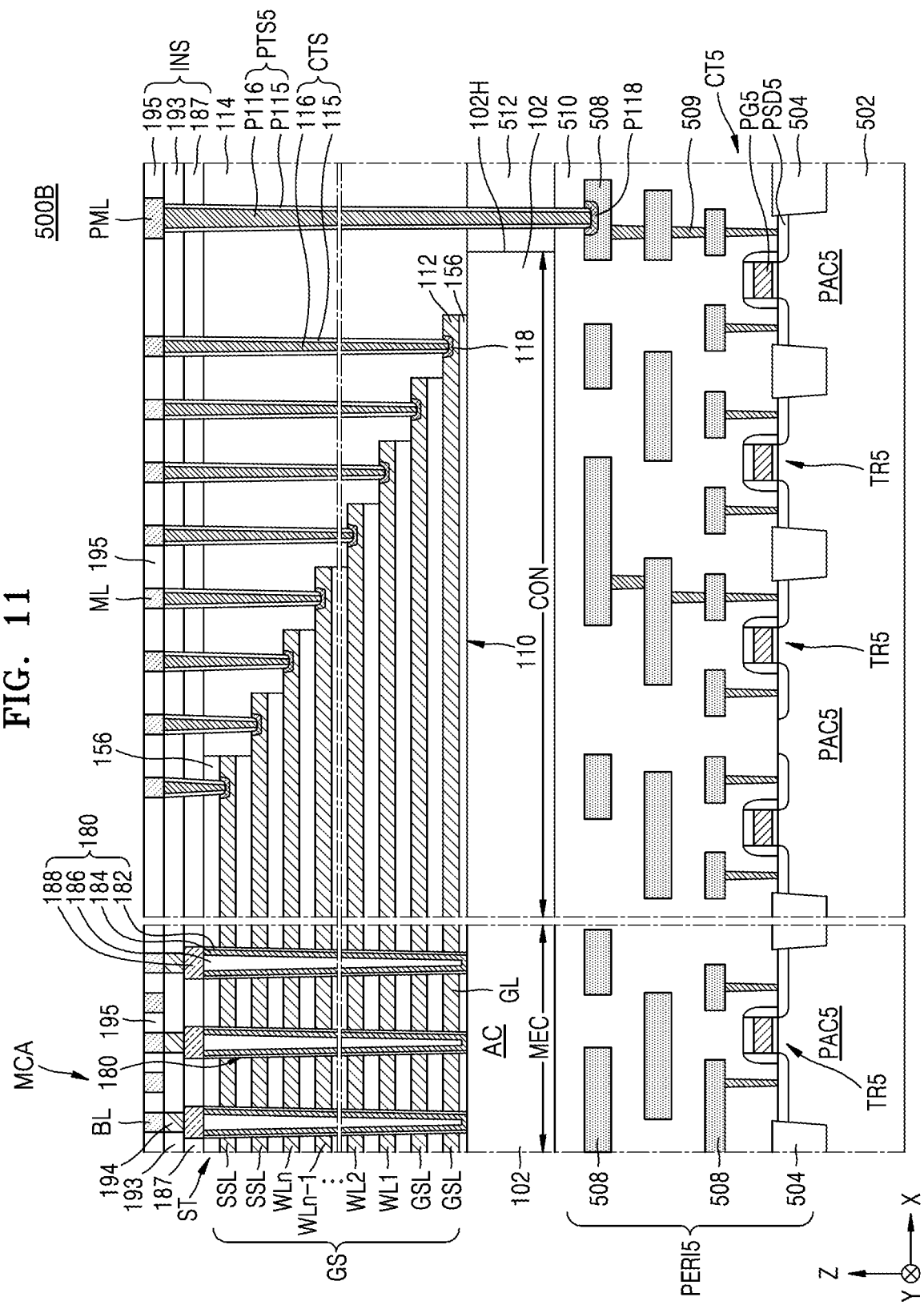
Figure 12:
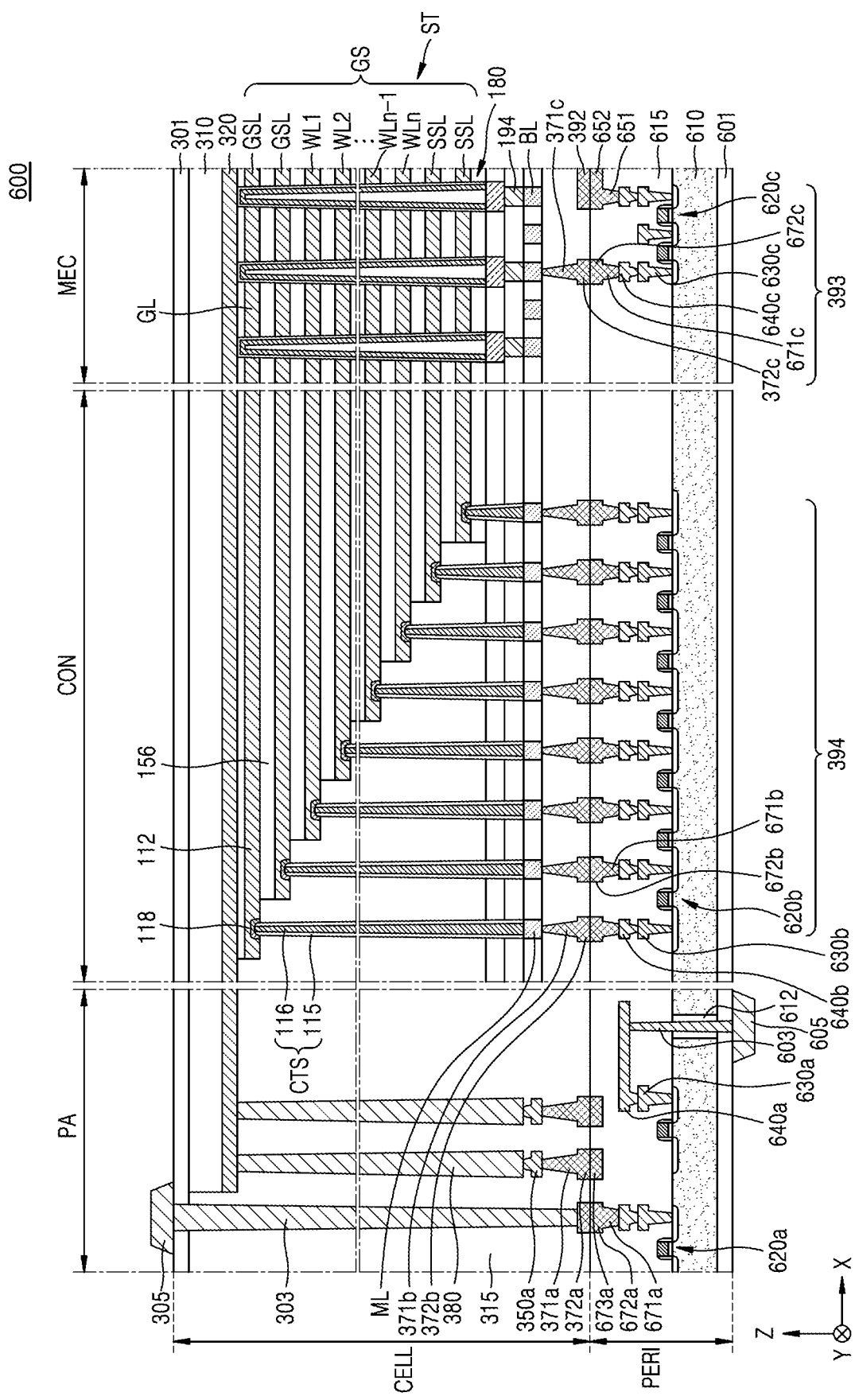
Figure 13:
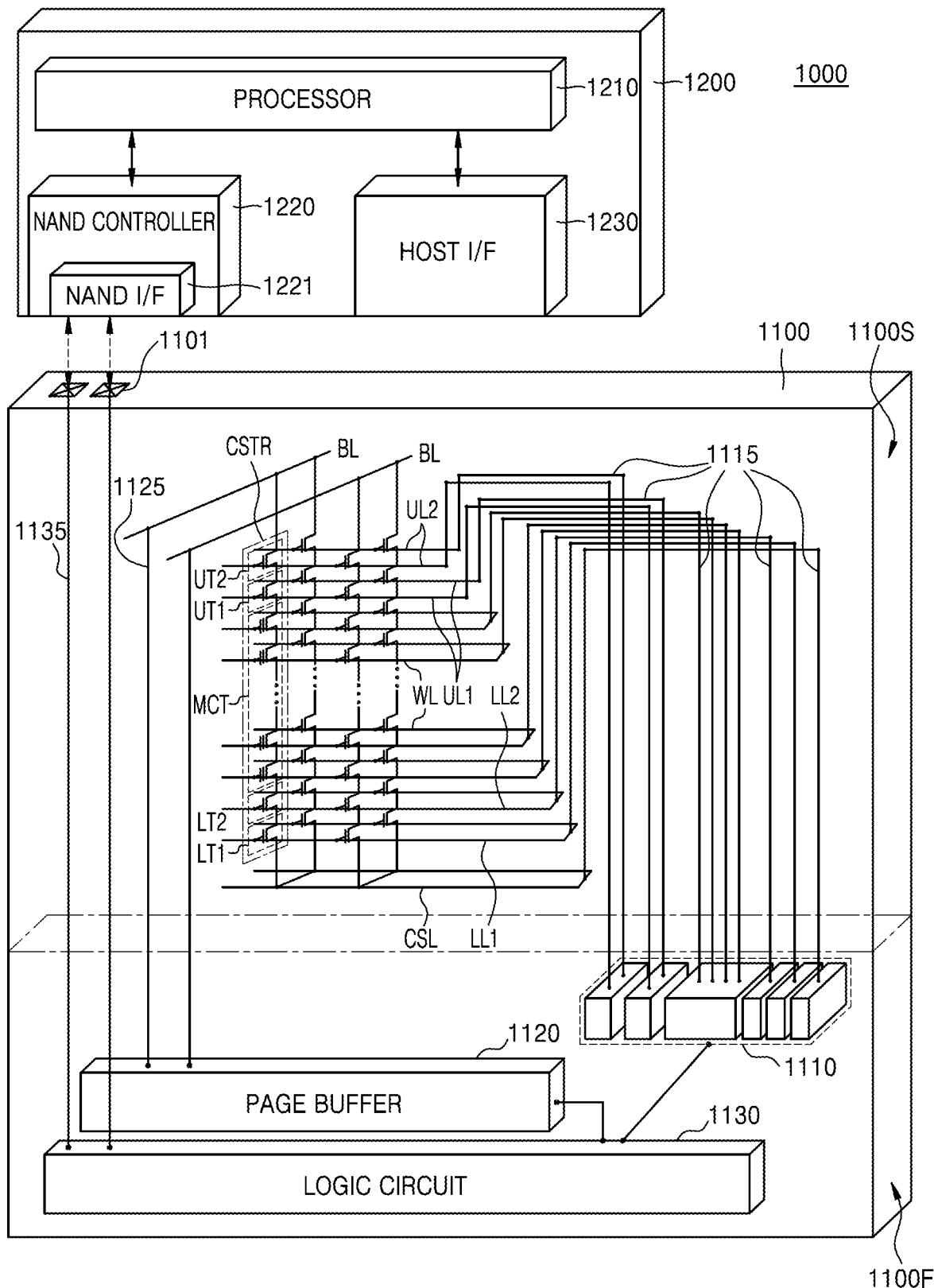
Figure 14:
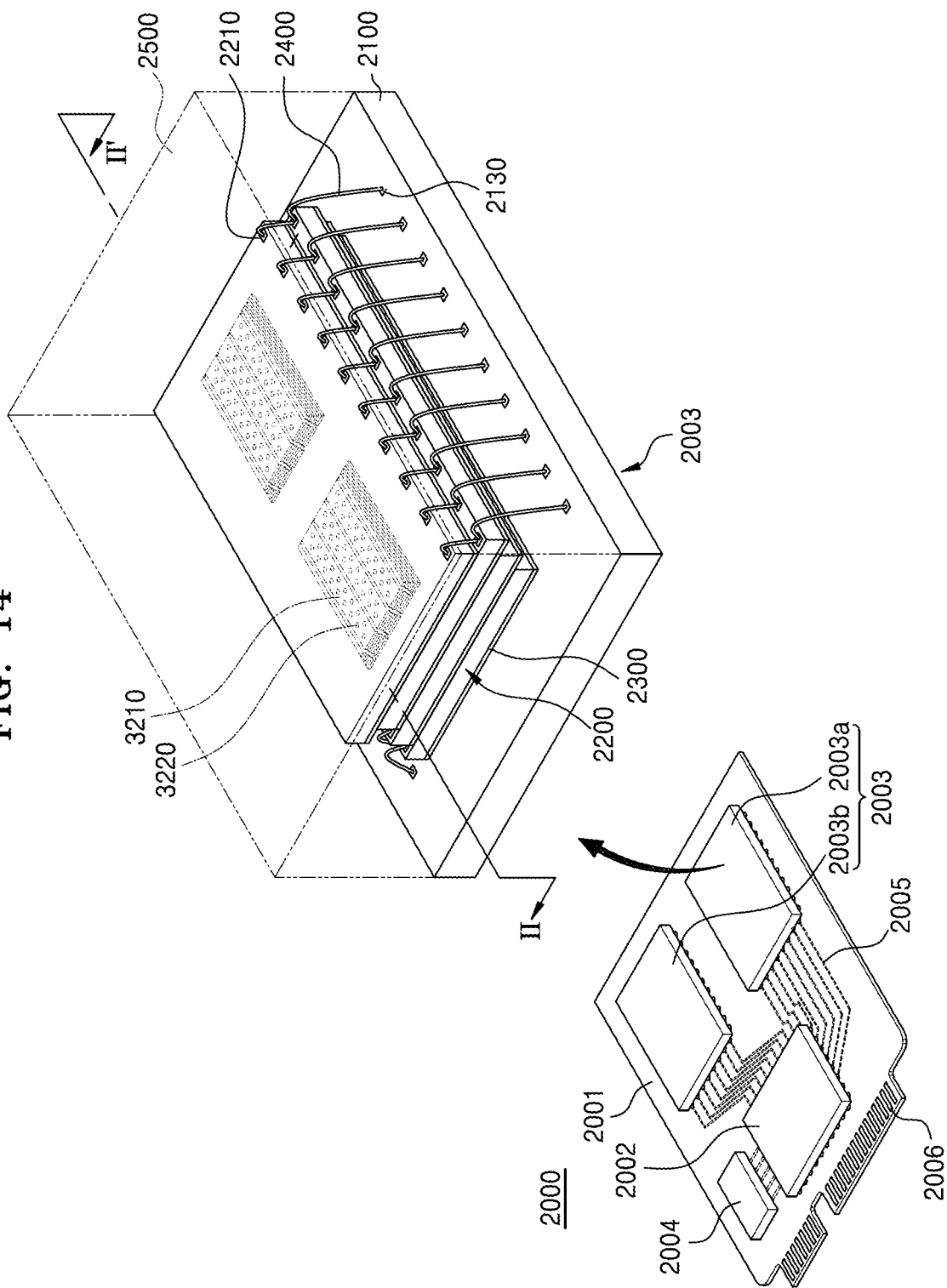
Figure 15:
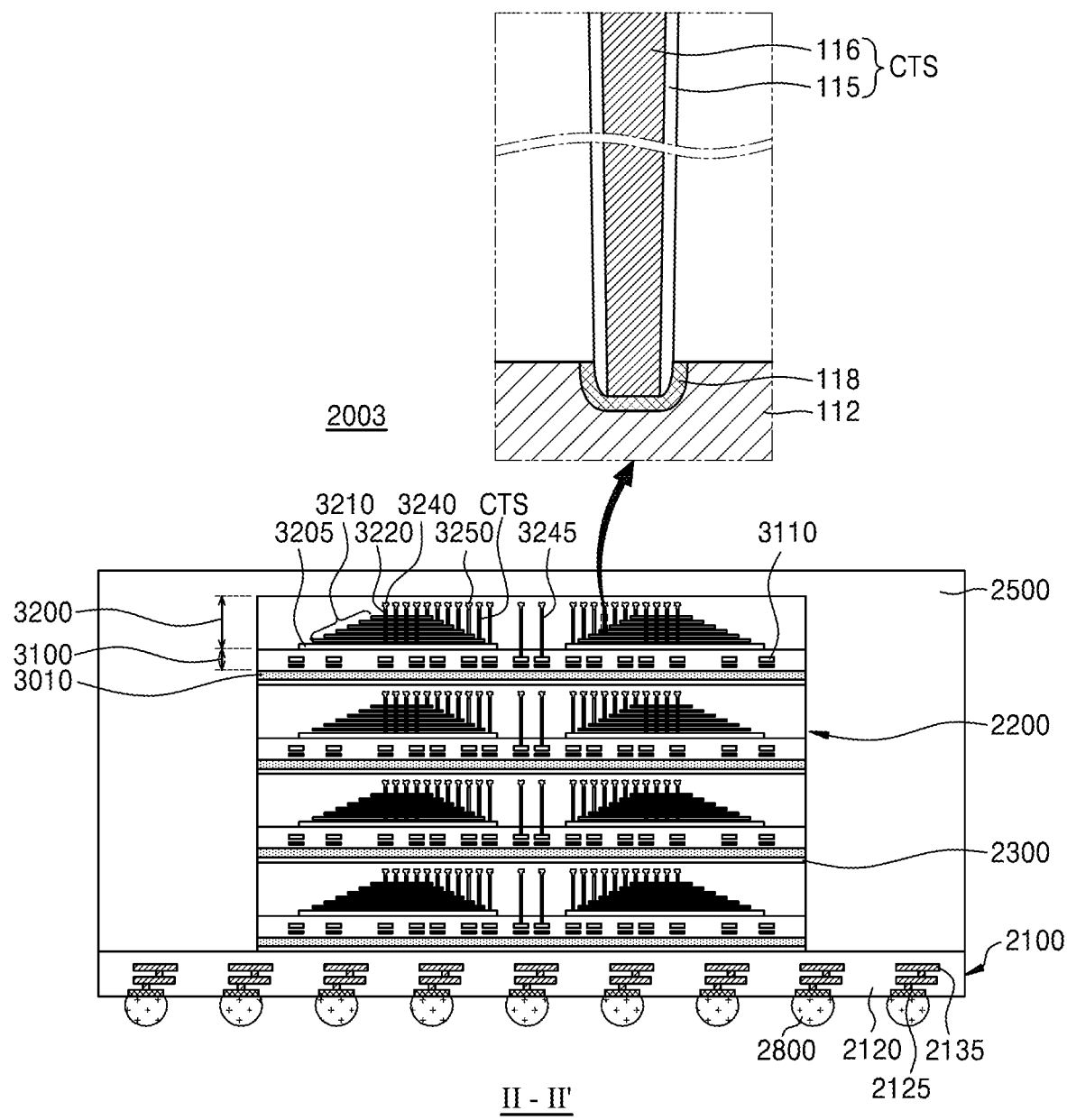
Figure 16:
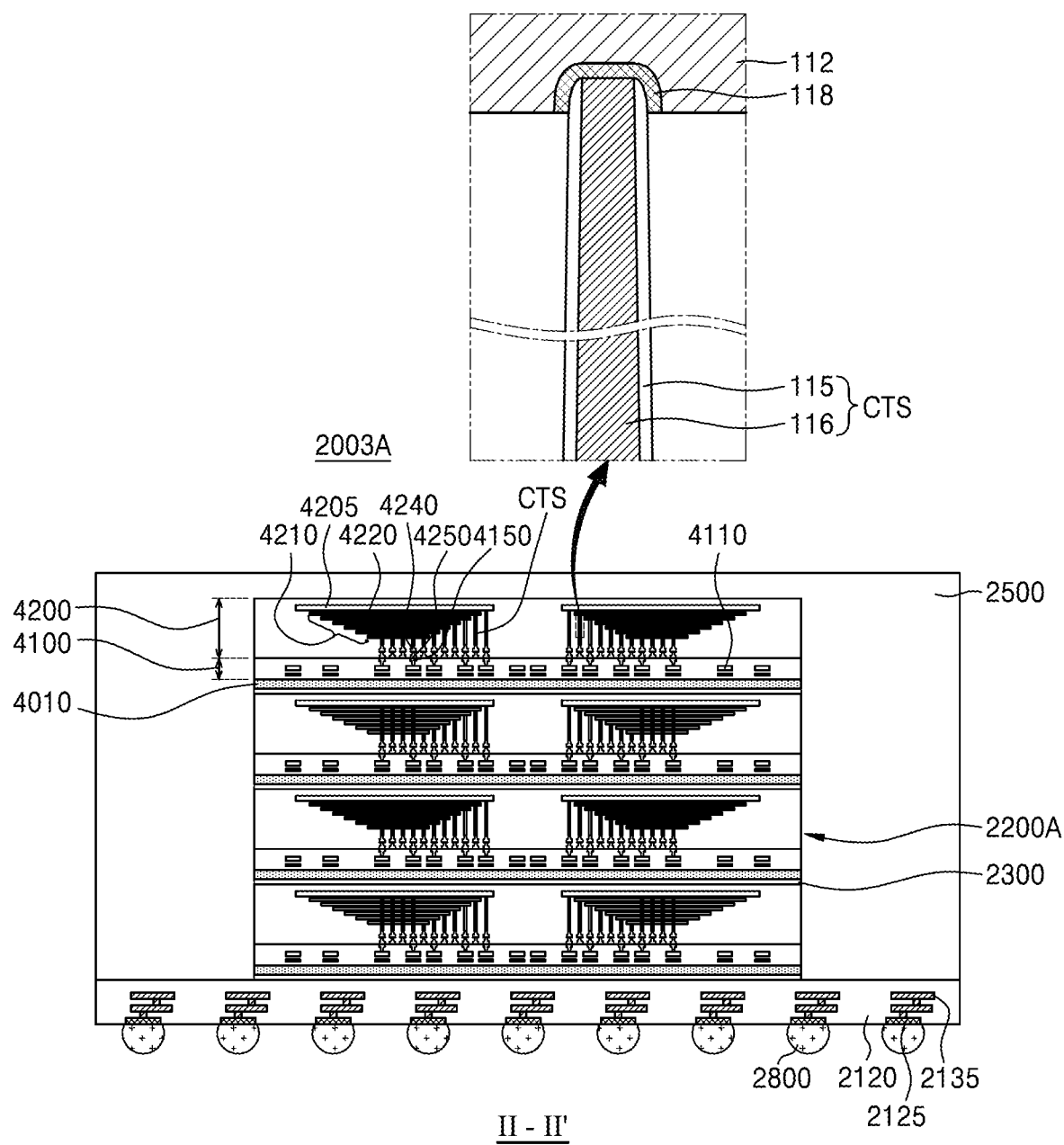

8A, and (B) in FIG. 8B is an enlarged cross-sectional view of a local region EX32 in FIG. 8A;

FIG. 9 is a cross-sectional view of a semiconductor device according to some embodiments of the inventive concepts;

FIG. 10 is a cross-sectional view of a semiconductor device according to some embodiments of the inventive concepts;

FIG. 11 is a cross-sectional view of a semiconductor device according to some embodiments of the inventive concepts;

FIG. 12 is a cross-sectional view of a semiconductor device according to some embodiments of the inventive concepts;

FIG. 13 is a schematic diagram of an electronic system including a semiconductor device, according to some embodiments of the inventive concepts;

FIG. 14 is a schematic perspective diagram of an electronic system including a semiconductor device, according to some embodiments of the inventive concepts;

FIG. 15 is a schematic cross-sectional view of a semiconductor package, according to some embodiments of the inventive concepts;

FIG. 16 is a schematic cross-sectional view of a semiconductor package, according to some embodiments of the inventive concepts;

FIGS. 17A through 17E are cross-sectional views illustrating a manufacturing method of a semiconductor device according to a process sequence, according to some embodiments of the inventive concepts; and FIGS. 18A through 18E are cross-sectional views illustrating processes of forming metal silicide layers and contact structures according to a manufacturing method of a semiconductor device according to a process sequence, according to some embodiments of the inventive concepts.

DETAILED DESCRIPTION

Hereinafter, some example embodiments of the inventive concepts are described in detail with reference to the accompanying drawings. Identical reference numerals are used for the same components in the drawings, and a duplicate description thereof will be omitted.

Figure 1:
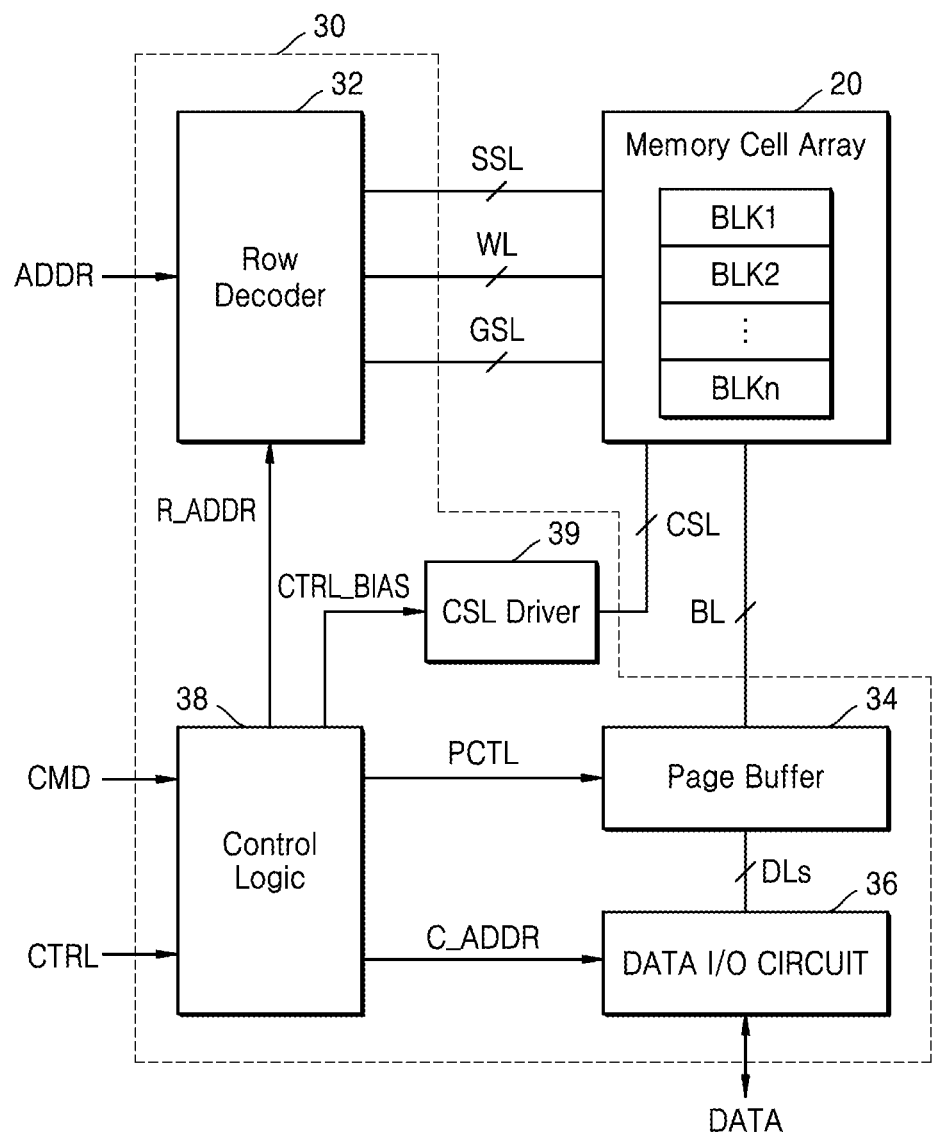
FIG. 1 is a block diagram of a semiconductor device according to some embodiments of the inventive concepts.

FIG. 1 is a block diagram of a semiconductor device 10 according to some embodiments of the inventive concepts.

Referring to FIG. 1, the semiconductor device 10 may include a memory cell array 20 and a periphery circuit 30. The memory cell array 20 may include first through $n^{th}$ memory cell blocks BLK1 through BLKn. The first through $n^{th}$ memory cell blocks BLK1 through BLKn may each include a plurality of memory cells (not shown in FIG. 1). Each of the first through $n^{th}$ memory cell blocks BLK1 through BLKn may be connected to the periphery circuit 30 via at least one bit line BL, at least one word line WL, at least one string select line SSL, at least one ground select line GSL, and a common source line CSL. As discussed in greater detail with respect to FIGS. 4 and 5, the at least one word lines WL, at least one string select line SSL and at least one ground select line GSL may be referred to as a gate stack GS.

The periphery circuit 30 may include a row decoder 32, a page buffer 34, a data input and output (I/O) circuit 36, a control logic 38, and a CSL driver 39. Although not illustrated in FIG. 1, the periphery circuit 30 may further include various circuits such as a voltage generation circuit for generating various voltages required for an operation of the memory device 10, an error correction circuit for correcting errors of data read from the memory cell array 20, and an I/O interface.

The memory cell array 20 may be connected to the page buffer circuit 34 via the bit line BL, and may be connected to the row decoder 32 via the at least one word line WL, the at least one string select line SSL, and the at least one ground select line GSL. In the memory cell array 20, each of the plurality of memory cells included in the first through $n^{th}$ memory cell blocks BLK1 through BLKn may include a flash memory cell. The memory cell array 20 may include a three-dimensional memory cell array. The three-dimensional memory cell array may include a plurality of NAND strings, and the plurality of NAND strings may include a plurality of vertically stacked memory cells respectively connected to a gate stack GS.

The periphery circuit 30 may receive an address ADDR, a command CMD, and a control signal CTRL from the outside of the memory device 10, and may transmit and receive data DATA to/from a device outside the memory device 10.

The row decoder 32 may select at least one of the first through $n^{th}$ memory cell blocks BLK1 through BLKn in response to the address ADDR from the outside of the memory device 10, and may select the gate stack GS (e.g., the at least one word line WL, the at least one string selection line SSL, and the at least one ground selection line GSL) of the selected memory cell block BLK1 through BLKn. The row decoder 32 may transmit a voltage for performing a memory operation to the gate stack GS of the selected memory cell block BLK1 through BLKn.

The page buffer 34 may be connected to the memory cell array 20 via the bit line BL. The page buffer 34 may act as an input driver during a program operation and may apply to the bit line BL a voltage according to data DATA to be stored in the memory cell array 20. The page buffer 34 may act as a sense amplifier during a read operation and detect the data DATA stored in the memory cell array 20. The page buffer 34 may operate according to a control signal PCTL provided by the control logic 38.

The data I/O circuit 36 may be connected to the page buffer 34 via a plurality of data lines DL. The data I/O circuit 36 may receive the data DATA from a memory controller (not illustrated) during the program operation, and provide program data DATA to the page buffer 34 based on a column address C_ADDR provided by the control logic 38. The data I/O circuit 36 may provide the memory controller with read data DATA that has been stored in the page buffer 34, based on the column address C_ADDR provided by the control logic 38 during the read operation.

The data I/O circuit 36 may transmit an address or a command to be input to the control logic 38 or the row decoder 32. The periphery circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32, and provide the column address C_ADDR to the data I/O circuit 36. The control logic 38 may generate various internal control signals used in the semiconductor device 10 in response to the control signal CTRL. For example, the control logic 38 may control voltage levels to be provided to the gate stack GS and the bit line BL when memory operations such as the program operation and an erase operation are performed.

The CSL driver 39 may be connected to the memory cell array 20 via the common source line CSL. The CSL driver 39 may apply a common source voltage (for example, a power voltage) or a ground voltage to the common source line CSL based on a control of the control logic 38. In example embodiments, the CSL driver 39 may be at a bottom of the memory cell array 20. The CSL driver 39 may vertically overlap at least a portion of the memory cell array 20.

Figure 2:
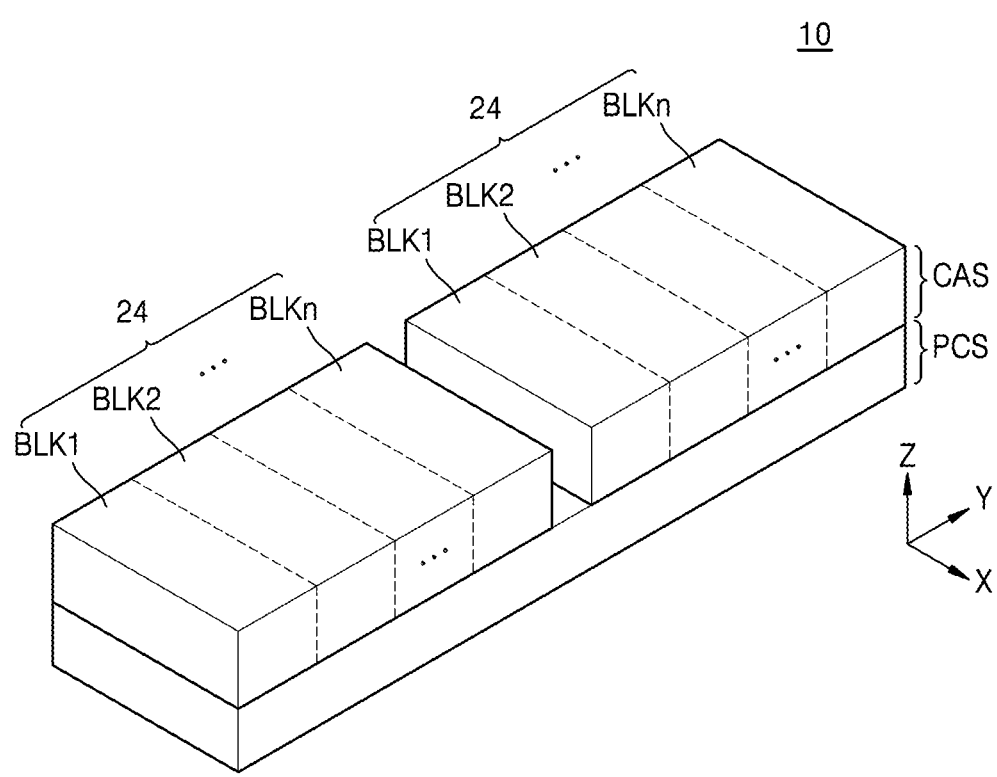
FIG. 2 is a schematic perspective view of a semiconductor device according to some embodiments of the inventive concepts.

FIG. 2 is a schematic perspective view of a semiconductor device 10 according to some embodiments of the inventive concepts.

Referring to FIG. 2, the semiconductor device 10 may include a cell array structure CAS and a periphery circuit structure PCS, which may overlap in a vertical direction (e.g., a Z direction). The cell array structure CAS may include the memory cell array 20 described above with reference to FIG. 1. The periphery circuit structure PCS may include the periphery circuit 30 described above with reference to FIG. 1.

The cell array structure CAS may include a plurality of tiles 24. The plurality of tiles 24 may each include the first through $n^{th}$ memory cell blocks BLK1 through BLKn. The first through $n^{th}$ memory cell blocks BLK1 through BLKn may each include memory cells that are arranged in a three-dimensional array.

In some example embodiments, two tiles 24 may constitute one mat, but the present disclosure is not limited thereto. The memory cell array 20 described above with reference to FIG. 1 may include a plurality of mats, for example, four mats, but the present disclosure is not limited thereto.

Figure 3:
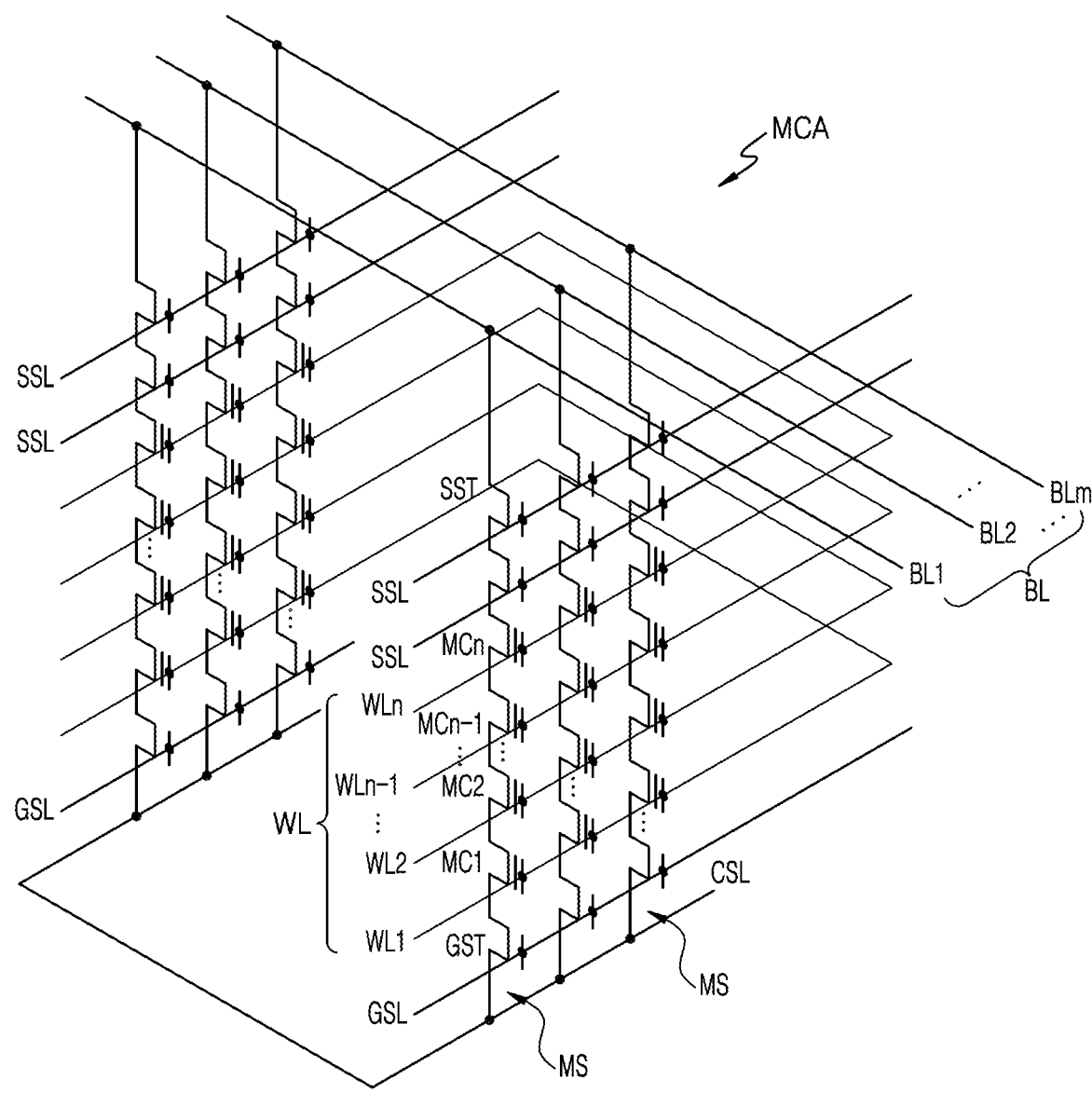
FIG. 3 illustrates an equivalent circuit diagram of a memory cell array of a semiconductor device, according to some embodiments of the inventive concepts.

FIG. 3 is an equivalent circuit diagram of a memory cell array MCA of a semiconductor device, according to some embodiments of the inventive concepts. FIG. 3 illustrates an equivalent circuit diagram of a vertical NAND flash memory element having a vertical channel structure. The first through $n^{th}$ memory cell blocks BLK1 through BLKn illustrated in FIG. 2 may each include the memory cell array MCA including the equivalent circuit configuration illustrated in FIG. 3.

Referring to FIG. 3, the memory cell array MCA may include a plurality of memory cell strings MS. The memory cell array MCA may include a plurality of bit lines BL or first through $m^{th}$ bit lines BL1 through BLm, a plurality of word lines WL or first through $n^{th}$ word lines WL1 through WLn, at least one string select line SSL, at least one ground select line GSL, and the common source line CSL. The plurality of memory cell strings MS may be formed between the plurality of bit lines BL and the common source line CSL. FIG. 3 illustrates a case in which each of the plurality of memory cell strings MS includes two string select lines SSL, but the present disclosure is not limited thereto. For example, each of the plurality of memory cell strings MS may include one string select line SSL.

Each of the plurality of memory cell strings MS may include a string select transistor SST, a ground select transistor GST, and first through $n^{th}$ memory cell transistors MC1 through MCn. A drain region of the string select transistor SST may be connected to one of the bit lines BL, and a source region of the ground select transistor GST may be connected to the common source line CSL. The common source line CSL may be a region where the source regions of the plurality of ground select transistors GST are connected to each other in common.

The string select transistor SST may be connected to the string select line SSL, and the ground select transistor GST may be connected to the ground select line GSL. The first through $n^{th}$ memory cell transistors MC1 through MCn may be respectively connected to the plurality of word lines WL.

Figure 4:
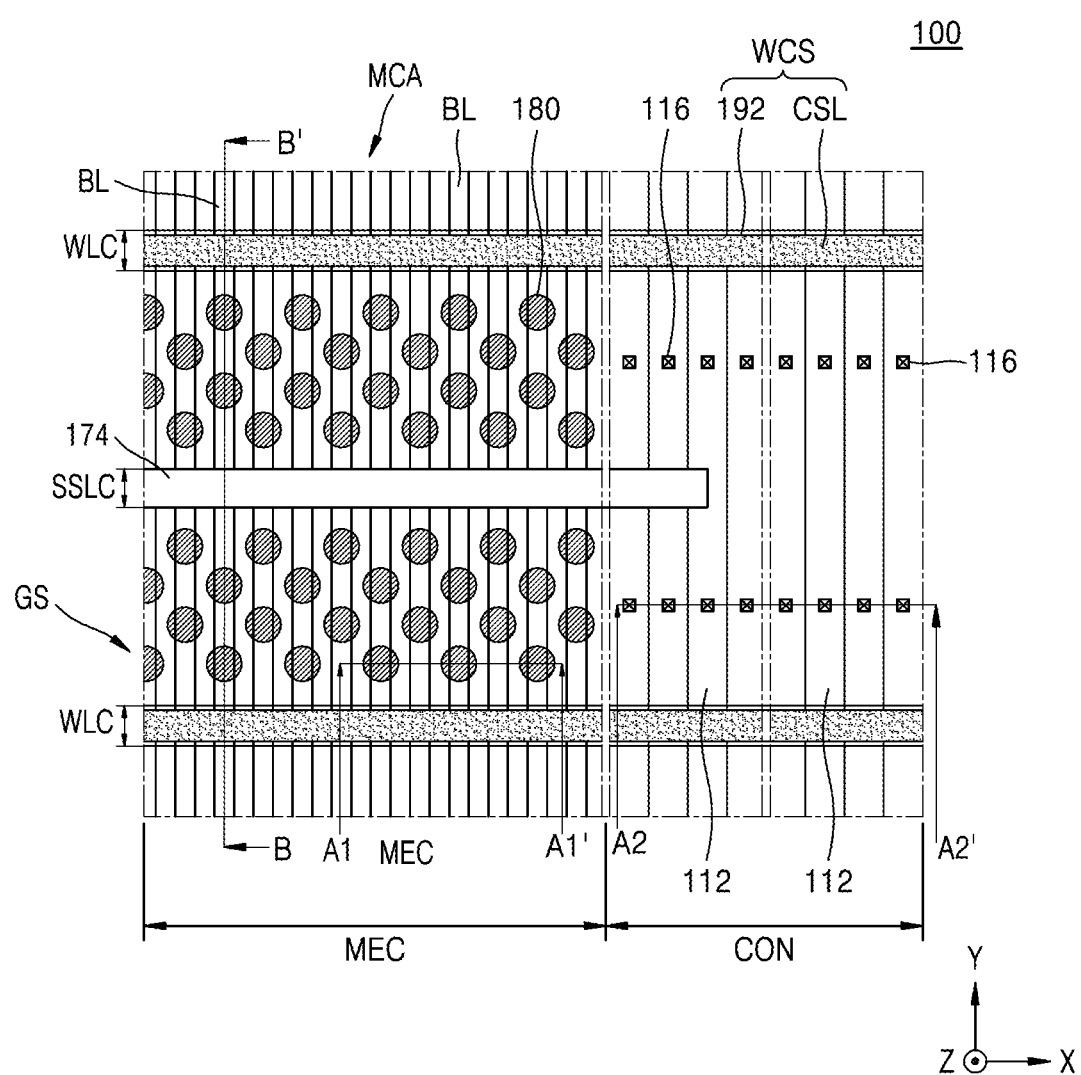
FIG. 4 is a plan view of main components of a semiconductor device, according to some embodiments of the inventive concepts.
Figure 5A:
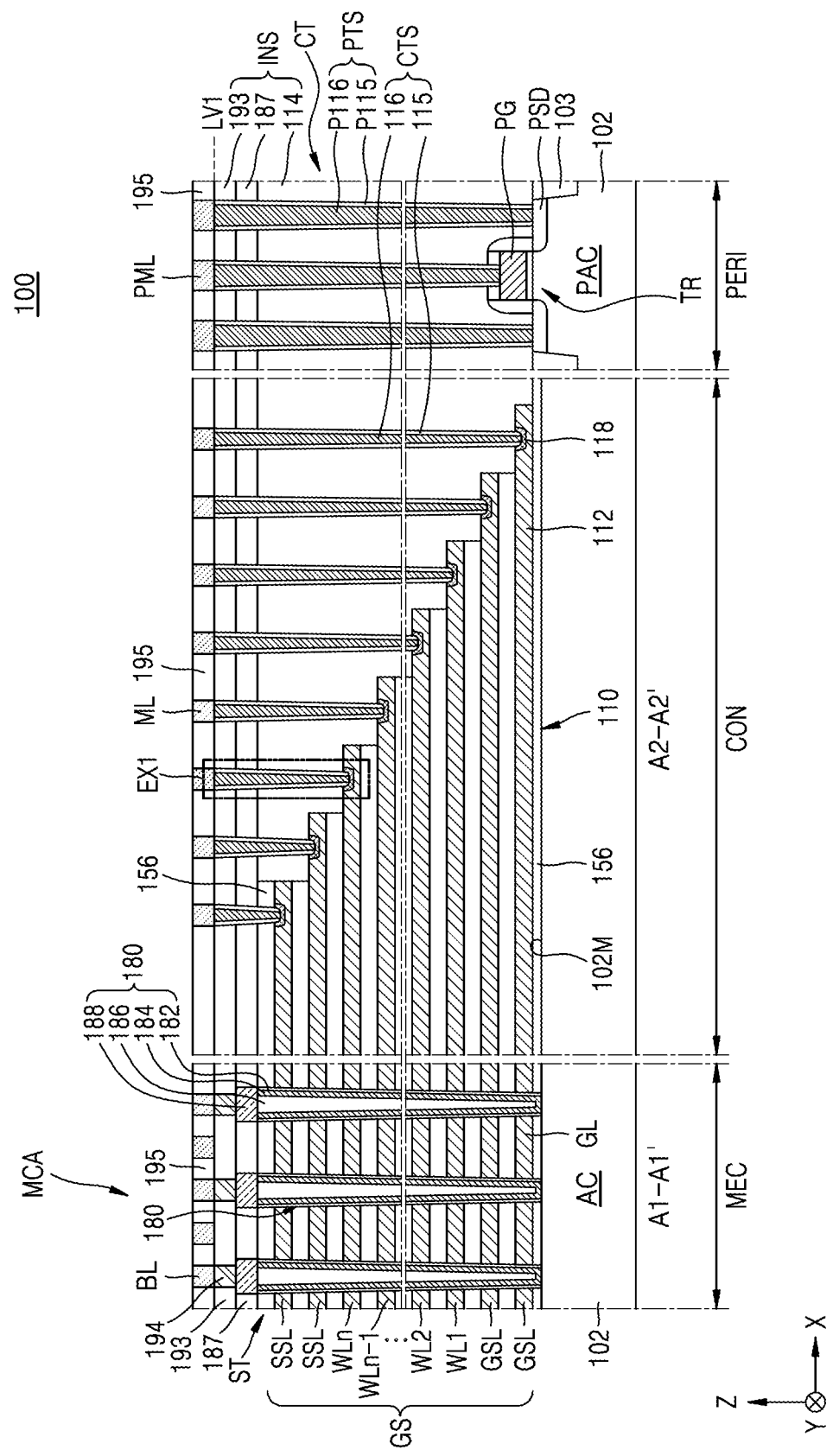
FIG. 5A illustrates cross-sectional views taken along lines A1-A1' and A2-A2' in FIG. 4, and a cross-sectional view of some region of a periphery circuit region.
Figure 5B:
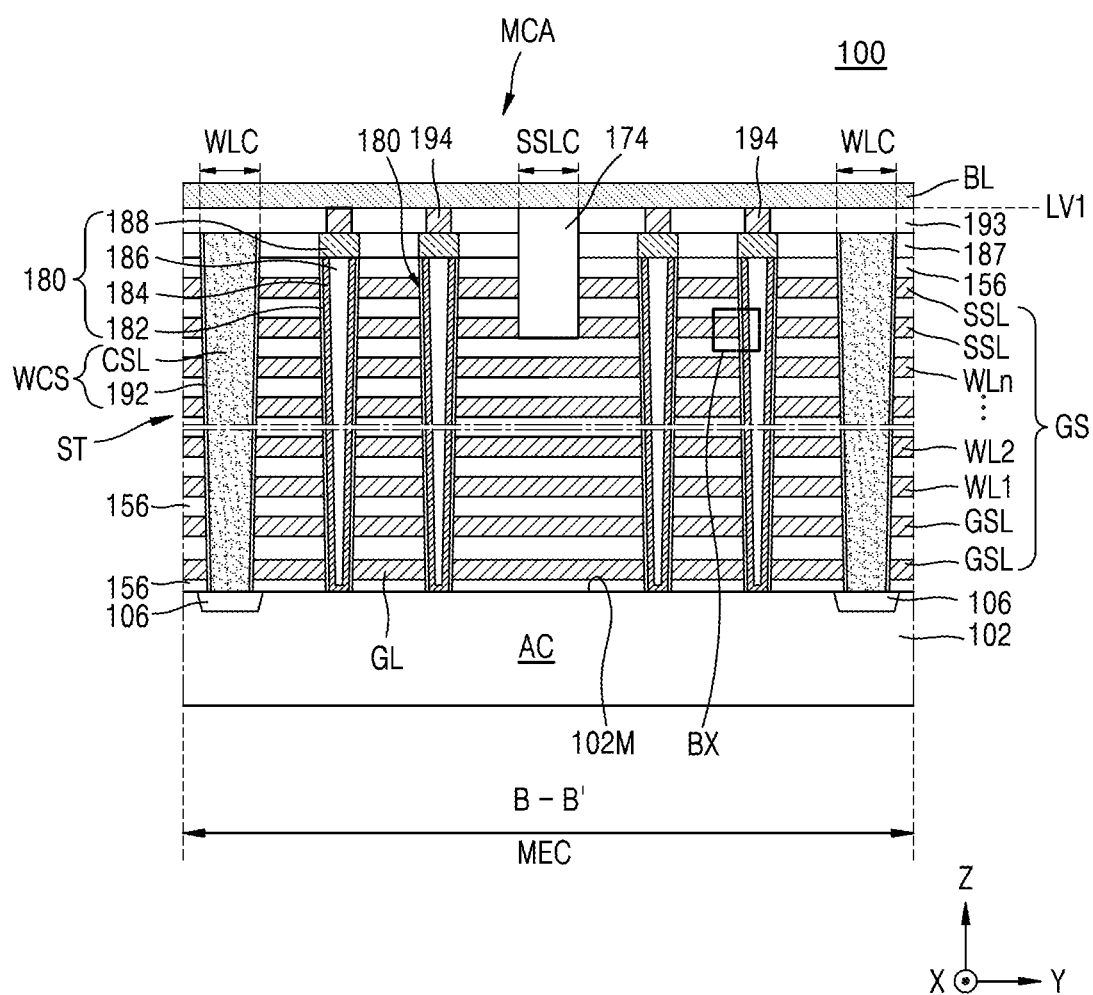
FIG. 5B is a cross-sectional view taken along line B-B' in FIG. 4.
Figure 5C:
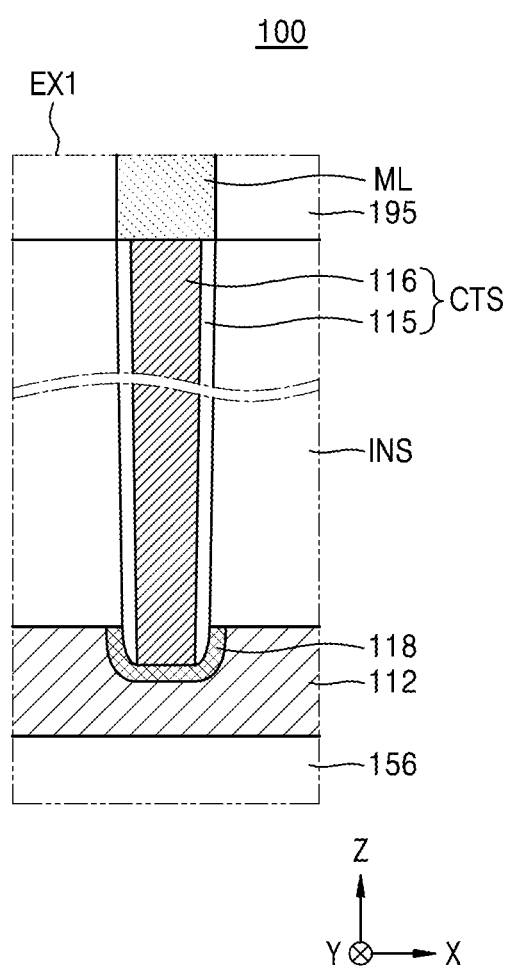
FIG. 5C is an enlarged cross-sectional view of a local region EX1 in FIG. 5A.

FIG. 4 is a plan view of main components of a semiconductor device 100, according to some embodiments of the inventive concepts. FIG. 5A illustrates cross-sectional views taken along lines A1-A1' and A2-A2' in FIG. 4, and also illustrates a cross-sectional view of a periphery circuit region PERI of the semiconductor device 100 that is not seen in the plan view of FIG. 4. FIG. 5B is a cross-sectional view taken along line B-B' in FIG. 4. FIG. 5C is an enlarged cross-sectional view of a local region EX1 in FIG. 5A.

Referring to FIGS. 4 and 5A through 5C, the semiconductor device 100 may include a substrate 102 having a memory cell region MEC, a connection region CON, and the periphery circuit region PERI. The substrate 102 may have a main surface 102M extending in a horizontal direction following an X-Y plane. The substrate 102 may include silicon (Si), germanium (Ge), or silicon-germanium (SiGe). The memory cell array MCA may be formed in an active region AC of the memory cell region MEC.

The connection region CON may be adjacent to an edge side of the memory cell region MEC. The memory cell region MEC may be apart from the periphery circuit region PERI with the connection region CON therebetween. In FIG. 5A, only the connection region CON on one side of the memory cell region MEC is illustrated, but in some embodiments a connection region CON may be on each of both sides of the memory cell region MEC in a first horizontal direction (X direction).

The gate stack GS may be in the memory cell region MEC and the connection region CON of the substrate 102. The gate stack GS may include a plurality of gate lines GL and a plurality of conductive pad regions 112 integrally connected to the plurality of gate lines GL. A portion of the gate stack GS in the memory cell region MEC may constitute a memory stack ST. The memory stack ST may include 48, 64, 96, or 128 gate lines GL stacked in a vertical direction (Z direction), however, the present disclosure is not limited thereto. The plurality of gate lines GL included in the gate stack GS may be in the memory cell region MEC, with the plurality of gate lines GL in the memory cell region MEC extending in a horizontal direction parallel with the main surface 102M of the substrate 102, and overlapping each other in the vertical direction (Z direction). The plurality of gate lines GL may include the plurality of word lines WL, that is, the first through $n^{th}$ word lines WL1 through WLn, at least one ground select line GSL, and at least one string select line SSL. In FIGS. 5A and 5B, a case is illustrated in which the plurality of gate lines GL include two ground select lines GSL and two string select lines SSL, but the present disclosure is not limited thereto.

The plurality of conductive pad regions 112 included in the gate stack GS may be in the connection region CON and constitute a stepped connection unit 110. As seen in FIG. 4, in the connection region CON, a first conductive pad region 112 closer to the substrate 102 in the vertical direction may extend farther in the first horizontal direction (X direction) than a second conductive pad region 112 that is farther from the substrate 102 than the first conductive pad region 112. Each of the plurality of conductive pad regions 112 may be integrally connected to one gate line GL of the plurality of gate lines GL.

As illustrated in FIGS. 4 and 5B, a plurality of word line cut regions WLC may extend in the first horizontal direction (X direction) parallel with the main surface 102M of the substrate 102. The plurality of word line cut regions WLC may limit a width of the gate stack GS in a second horizontal direction (Y direction) perpendicular to the first horizontal direction (X direction). The gate stacks GS may be repeatedly apart from each other at a uniform interval by the plurality of word line cut regions WLC.

As illustrated in FIG. 5B, a plurality of common source regions 106 may extend in the first horizontal direction (X direction) in the substrate 102. In some example embodiments, the plurality of common source regions 106 may include impurity regions where n-type impurities are heavily doped thereon. The plurality of common source lines CSL may extend in the first horizontal direction (X direction) on the plurality of common source regions 106. The plurality of common source lines CSL may fill a portion of the word line cut region WLC on each side of the gate stack GS. The common source line CSL may be surrounded by an insulating spacer 192 in the word line cut region WLC. The common source lines CSL and the insulating spacer 192 may constitute a word line cut structure WCS that penetrates the memory stack ST.

Also, as illustrated in FIG. 5B, two string select lines SSL adjacent to each other in the second horizontal direction (Y direction) may be apart from each other with a string select line cut region SSLC therebetween. The string select line cut region SSLC may be filled with an insulating layer 174. The insulating layer 174 may include an oxide layer, a nitride layer, or a combination thereof. In some example embodiments, at least some of the string select line cut regions SSLC may be filled with an air gap.

The plurality of gate lines GL and the plurality of conductive pad regions 112 may each include a metal, a conductive metal nitrate, or a combination thereof. For example, the plurality of gate lines GL and the conductive pad regions 112 may each include tungsten, nickel, cobalt, tantalum, tungsten nitrate, titanium nitrate, tantalum nitrate, or a combination thereof, but the present disclosure is not limited thereto.

As illustrated in FIGS. 5A and 5B, the plurality of gate lines GL in combination with the plurality of conductive pad regions 112 may be alternately stacked with a plurality of insulating layers 156. In other words, an insulating layer 156 may be between the substrate 102 and the ground select line GSL, and an insulating layer 156 may be above and below ground select line GSL, each of the plurality of word lines WL, that is, the first through $n^{th}$ word lines WL1 through WLn, and each string select line SSL. An insulating layer 156 may be between pairs of adjacent gate lines GL and pairs of adjacent conductive pad regions 112, and each gate line GL/conductive pad region 112 may be included in more than one pair of adjacent gate lines GL/conductive pad region 112. The insulating layer 156 closest to the substrate 102 of the plurality of insulating layers 156 on the substrate 102 may have a smaller thickness than other insulating layers 156. The plurality of insulating layers 156 may include silicon oxide, silicon nitride, or SiON, as examples.

In the memory cell region MEC, a plurality of channel structures 180 may penetrate the plurality of gate lines GL and the plurality of insulating layers 156, and may extend in the vertical direction (Z direction). The plurality of channel structures 180 may be spaced apart from each other at a certain interval in the first horizontal direction (X direction) and the second horizontal direction (Y direction).

The plurality of channel structures 180 may each include a gate dielectric layer 182, a channel region 184, a buried insulating layer 186, and a drain region 188. The channel region 184 may include doped polysilicon and/or undoped polysilicon. The channel region 184 may have a cylindrical or pipe shape. An internal space of the channel region 184 may be filled with the buried insulating layer 186. The buried insulating layer 186 may include an insulating material. For example, the buried insulating layer 186 may include silicon oxide, silicon nitride, SiON, or a combination thereof. In some example embodiments, the buried insulating layer 186 may be omitted, and the channel region 184 may have a pillar structure without an internal space thereof. The drain region 188 may include impurity-doped polysilicon, metal, or conductive metal nitride, or a combination thereof. A metal constituting the drain region 188 may include, for example, tungsten, nickel, cobalt, tantalum, etc.

The plurality of drain regions 188 may be insulated from each other by an intermediate insulating layer 187. The intermediate insulating layer 187 may include an oxide layer, a nitride layer, or a combination thereof.

In FIGS. 5A and 5B, the channel structure 180 is illustrated as including the gate dielectric layer 182, and the gate dielectric layer 182 has a shape extending along the channel region 184 in the vertical direction (Z direction), but the present disclosure is not limited thereto, and various modifications and changes thereof may be made.

Figure 6A:
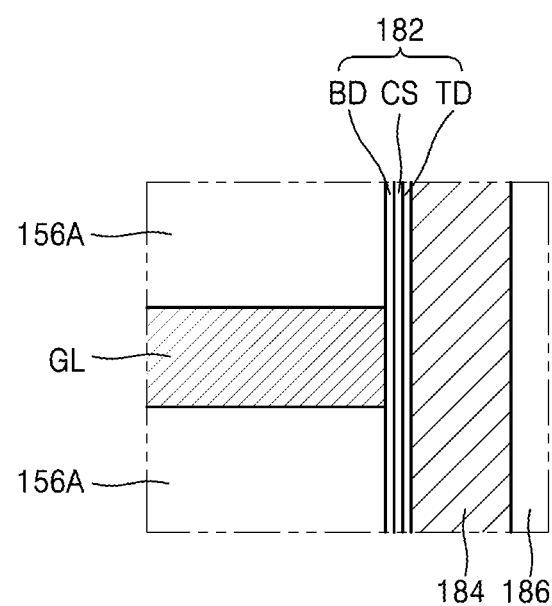
FIG. 6A is a cross-sectional view of a region indicated as BX in FIG. 5B.

FIG. 6A is a detailed cross-sectional view of the gate dielectric layer 182 illustrated in FIGS. 5A and 5B, and is an enlarged view of a region BX in FIG. 5B.

Referring to FIG. 6A, the gate dielectric layer 182 may have a structure including a tunneling dielectric layer TD, a charge storage layer CS, and a blocking dielectric layer BD, which are sequentially formed from the channel region 184. Relative thicknesses of the tunneling dielectric layer TD, the charge storage layer CS, and the blocking dielectric layer BD are not limited to those illustrated in FIG. 6A, and may be variously modified.

The tunneling dielectric layer TD may include silicon oxide, hafnium oxide, aluminum oxide, zirconium oxide, tantalum oxide, or the like. The charge storage layer CS may be an area in which electrons having passed through the tunneling dielectric layer TD from the channel region 184 are stored, and may include silicon nitride, boron nitride, silicon boron nitride, or impurities-doped polysilicon. The blocking dielectric layer BD may include silicon oxide, silicon nitride, or a metal oxide having a higher dielectric constant than silicon oxide. The metal oxide may include hafnium oxide, aluminum oxide, zirconium oxide, tantalum oxide, or a combination thereof.

Figure 6B:
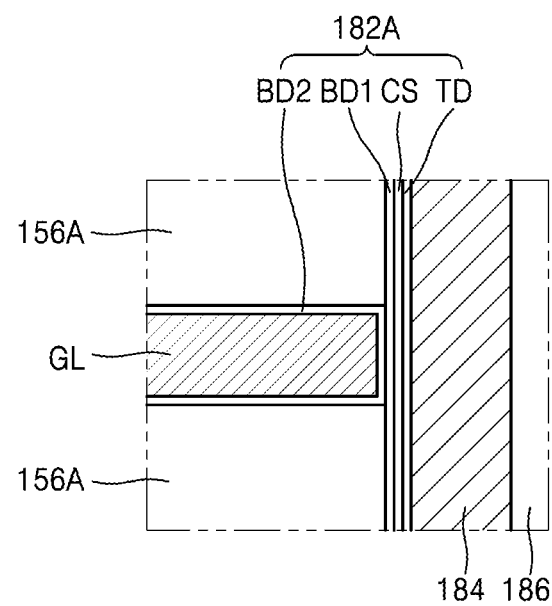
FIGS. 6B through 6D each is a cross-sectional view of an example structure of a gate dielectric layer.
Figure 6C:
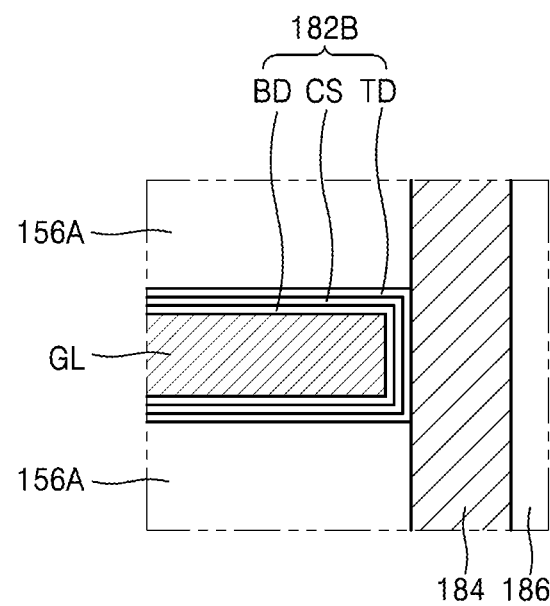
Figure 6D:
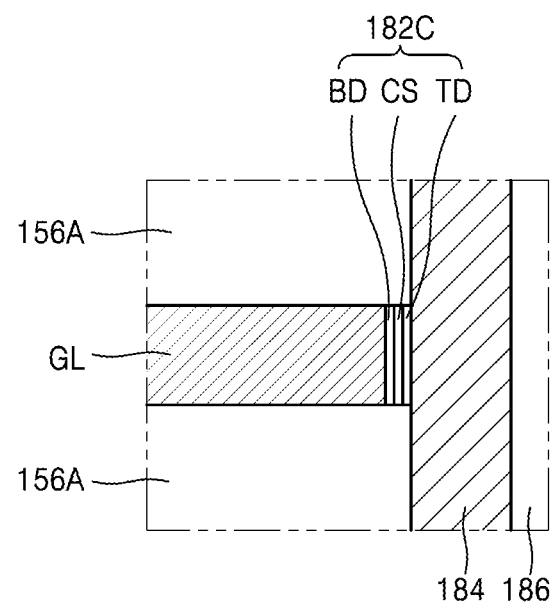

FIGS. 6B through 6D are cross-sectional views of example structures of gate dielectric layers 182A, 182B, and 182C, which are employable instead of the gate dielectric layer 182 illustrated in FIG. 6A.

In some example embodiments, the semiconductor device 100 may include the gate dielectric layer 182A illustrated in FIG. 6B instead of the gate dielectric layer 182. The gate dielectric layer 182A may include substantially the same configuration as the gate dielectric layer 182 illustrated in FIG. 6A. However, the gate dielectric layer 182A may include a first blocking dielectric layer BD1 and a second blocking dielectric layer BD2 instead of the blocking dielectric layer BD. The first blocking dielectric layer BD1 may extend in parallel with the channel region 184, and the second blocking dielectric layer BD2 may surround the gate line GL. The first blocking dielectric layer BD1 and the second blocking dielectric layer BD2 may each include silicon oxide, silicon nitride, or a metal oxide. For example, the first blocking dielectric layer BD1 may include a silicon oxide layer, and the second blocking dielectric layer BD2 may include a metal oxide layer having a greater dielectric constant than a silicon oxide layer.

In other example embodiments, the semiconductor device 100 may include the gate dielectric layer 182B illustrated in FIG. 6C instead of the gate dielectric layer 182. The gate dielectric layer 182B may cover a surface facing the channel region 184 and surfaces facing the insulating layer 156 of the gate line GL. The gate dielectric layer 182B may include the tunneling dielectric layer TD, the charge storage layer CS, and the blocking dielectric layer BD, which are sequentially formed from the channel region 184.

In addition, in other example embodiments, the semiconductor device 100 may include the gate dielectric layer 182C illustrated in FIG. 6D instead of the gate dielectric layer 182. The gate dielectric layer 182C may be between the gate line GL and the channel region 184, and cover sidewalls of the gate line GL, but may not cover a bottom surface and a top surface of the gate line GL. The gate dielectric layer 182C may include the tunneling dielectric layer TD, the charge storage layer CS, and the blocking dielectric layer BD, which are sequentially formed from the channel region 184.

Configurations and shapes of a gate dielectric layer that may be included in a semiconductor device according to embodiments of the inventive concept are not limited to only the gate dielectric layers 182, 182A, 182B, and 182C illustrated in FIGS. 6A through 6D, and various modifications and changes thereof may be made within the scope of the inventive concept.

Referring again to FIGS. 4 and 5A through 5C, each of the plurality of conductive pad regions 112 constituting the stepped connection unit 110 in the connection region CON may have a width that is reduced away from the substrate 102 in a horizontal direction.

In some example embodiments, a plurality of dummy channel structures (not illustrated) penetrating the stepped connection unit 110 may be in the connection region CON. By supporting edge portions of each of the gate stacks GS and the plurality of conductive pad regions 112, the plurality of dummy channel structures may prevent an occurrence of unwanted structural deformation, such as bending or breaking thereof.

In the memory cell region MEC, the plurality of bit lines BL may be above the memory stack ST. A plurality of bit line contact pads 194 may be between the plurality of channel structures 180 and the plurality of bit lines BL. The drain region 188 of each of the plurality of channel structures 180 may be connected, via a respective bit line contact pad 194, to one bit line BL from the plurality of bit lines BL. The plurality of bit line contact pads 194 may be insulated from each other by an upper insulating layer 193. The plurality of bit lines BL may be insulated from each other by the interlayer insulating layer 195. The plurality of bit line contact pads 194 and the plurality of bit lines BL may each include a metal, metal nitride, or a combination thereof. For example, the plurality of bit line contact pads 194 and the plurality of bit lines BL may each include tungsten, titanium, tantalum, copper, aluminum, titanium nitride, tantalum nitride, tungsten nitride, or a combination thereof. The upper insulating layer 193 and the interlayer insulating layer 195 may each include an oxide layer, a nitride layer, or a combination thereof.

In the connection region CON, an insulating layer 114 covering the stepped connection unit 110 may be between the substrate 102 and the intermediate insulating layer 187. The insulating layer 114 may cover the plurality of conductive pad regions 112. The insulating layer 114, the intermediate insulating layer 187, and the upper insulating layer 193 may constitute an insulating structure INS. The insulating structure INS may also be present in the periphery circuit region PERI.

In the connection region CON, a plurality of contact structures CTS extending in the vertical direction (Z direction) may be on the plurality of conductive pad regions 112 of the stepped connection unit 110. A plurality of metal silicide layers 118 may be at a plurality of connection portions between the plurality of contact structures CTS and the plurality of conductive pad regions 112.

Each of the plurality of contact structures CTS may include a contact plug 116 extending in the vertical direction (Z direction), and an insulating plug 115 surrounding the contact plug 116. The contact plug 116 of each of the plurality of contact structures CTS may be connected to the conductive pad region 112 of the stepped connection unit 110 via the plurality of metal silicide layers 118.

As illustrated in more detail in FIG. 5C, the metal silicide layer 118 and the contact structure CTS may extend into the conductive pad region 112 to a vertical level lower than a vertical level of an upper surface of the conductive pad region 112, and the lowest surface of the metal silicide layer 118 may be spaced apart from a lower surface of the conductive pad region 112. The term "vertical level" used in the present specification may indicate a distance in the vertical direction (Z direction or −Z direction) from an upper surface of the substrate 102. A vertical level of the uppermost surface of the metal silicide layer 118 may be substantially the same as the vertical level of the upper surface of the conductive pad region 112. The metal silicide layer 118 may surround a lower end of the contact structure CTS at a vertical level equal to or lower than the vertical level of the upper surface of the conductive pad region 112. The metal silicide layer 118 may contact the contact plug 116 of the contact structure CTS at a vertical level lower than the vertical level of the upper surface of the conductive pad region 112. The insulating plug 115 may include a portion between a lower end of the contact plug 116 and the metal silicide layer 118.

As illustrated in FIG. 5A, each of the plurality of contact structures CTS may extend in the vertical direction from the metal silicide layer 118 contacting a conductive pad region 112 to a first vertical level LV1 higher than a level of the memory stack ST. At least some of the plurality of contact structures CTS may penetrate the insulating layer INS including the insulating layer 114, the intermediate insulating layer 187, and the upper insulating layer 193. Some of the plurality of contact structures CTS may penetrate some components of the insulating layer INS and may not extend through the entire insulating layer INS. For example, the contact structure CTS connected to the conductive pad region 112 farthest from the substrate 102 of the plurality of conductive pad regions 112 may penetrate the insulating layer 156, the intermediate insulating layer 187, and the upper insulating layer 193 from the conductive pad region 112, and extend to the first vertical level LV1.

In the connection region CON, a plurality of wiring layers ML may be on the plurality of contact structures CTS. The plurality of wiring layers ML may be formed at the same level as the plurality of bit lines BL in the memory cell region MEC. Each of the plurality of wiring layers ML may be connected to the contact plug 116 of the contact structure CTS at the first vertical level LV1. Each of the plurality of wiring layers ML may be electrically connected to one conductive pad region 112 of the plurality of conductive pad regions 112 via one contact plug 116 of the plurality of contact plugs 116. The plurality of wiring layers ML may not include a portion vertically overlapping the memory stack ST. In the connection region CON, the plurality of wiring layers ML may be insulated from each other by the interlayer insulating layer 195.

The plurality of bit line contact pads 194 and the plurality of bit lines BL may each include tungsten, titanium, tantalum, copper, aluminum, titanium nitride, tantalum nitride, tungsten nitride, or a combination thereof. The plurality of insulating plugs 115 may include a silicon nitride layer, a silicon oxide layer, or a combination thereof.

In some embodiments, a first metal included in the plurality of metal silicide layers 118 may be the same as a second metal included in the plurality of contact plugs 116. In some other embodiments, the first metal included in the plurality of metal silicide layers 118 and the second metal included in the plurality of contact plugs 116 may be different from each other.

In some example embodiments, the metal silicide layer 118 may further include at least one element of nitrogen (N) and oxygen (O). For example, the metal silicide layer 118 may include WSi, WSiN, WSiO, or a combination thereof. The terms "WSi", "WSiN", and "WSiO" as used in the present specification may denote a material including elements included in each term, and may not represent a stoichiometric relationship.

A plurality of circuits CT may be formed on the periphery circuit region PERI. The plurality of circuits CT may be formed at a vertical level equal to or higher than the vertical level of the substrate 102. The plurality of circuits CT may include at least some of the row decoder 32, the page buffer 34, the data I/O circuit 36, the control logic 38, and the common source line driver 39, which are included in the periphery circuit 30 described with reference to FIG. 1.

An element isolation layer 103 defining a periphery active region PAC may be formed in the periphery circuit region PERI of the substrate 102. A periphery transistor TR may be formed in the periphery active region PAC. The periphery transistor TR may constitute a portion of the plurality of circuits CT formed on the periphery circuit region PERI. The periphery transistor TR may be electrically connected to the memory cell region MEC via a wiring structure in the connection region COM. The periphery transistor TR may include a periphery gate PG and a periphery source/drain region PSD formed on both sides of the periphery gate PG in the periphery active region PAC. In example embodiments, unit elements such as a resistor and a capacitor may be further arranged in the periphery circuit region PERI.

A plurality of periphery contact structures PTS may be in the periphery circuit region PERI. The plurality of periphery contact structures PTS may penetrate the insulating layer 114 from the periphery transistor TR, and may extend in the vertical direction (Z direction) to the first vertical level LV1.

Each of the plurality of contact structures CTS may include a periphery contact plug P116 extending in the vertical direction (Z direction), and a periphery insulating plug P115 surrounding the periphery contact plug P116.

A plurality of periphery wiring layers PML may be on the plurality of periphery contact plugs P116. The plurality of periphery wiring layers PML may extend in a horizontal direction at the first vertical level LV1 that is the same level as the level of the plurality of wiring layers ML formed in the connection region CON. Each of the plurality of periphery wiring layers PML may be connected to any one of the periphery gate PG and the periphery source/drain region PSD via any one of the plurality of periphery contact plugs P116. At least some of the plurality of periphery wiring layers PML may be connected to other circuits or wirings in the periphery circuit region PERI. The plurality of periphery wiring layers PML may be insulated from each other by the interlayer insulating layer 195.

The plurality of periphery contact plugs P116 and the plurality of periphery wiring layers PML may each include tungsten, titanium, tantalum, copper, aluminum, titanium nitride, tantalum nitride, tungsten nitride, or a combination thereof. The plurality of periphery insulating plugs P115 may include a silicon nitride layer, a silicon oxide layer, or a combination thereof.

Figure 7A:
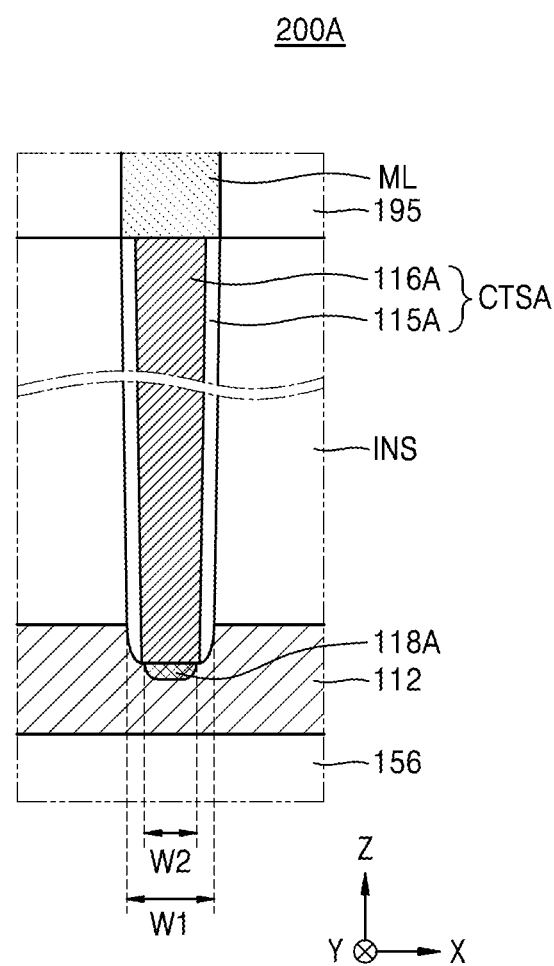
FIGS. 7A through 7C each is a cross-sectional view of a modified example of a semiconductor device, according to some embodiments of the inventive concepts.
Figure 7B:
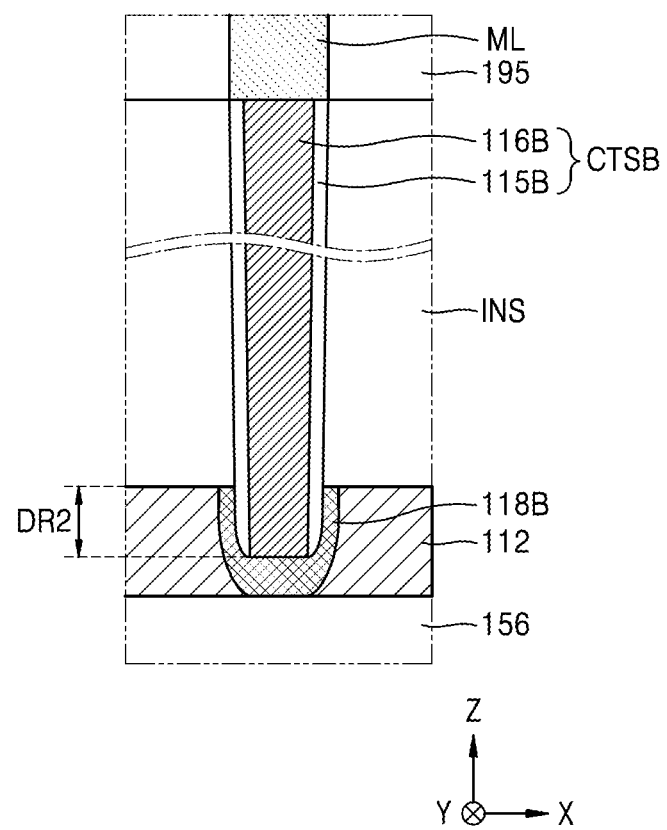
Figure 7C:
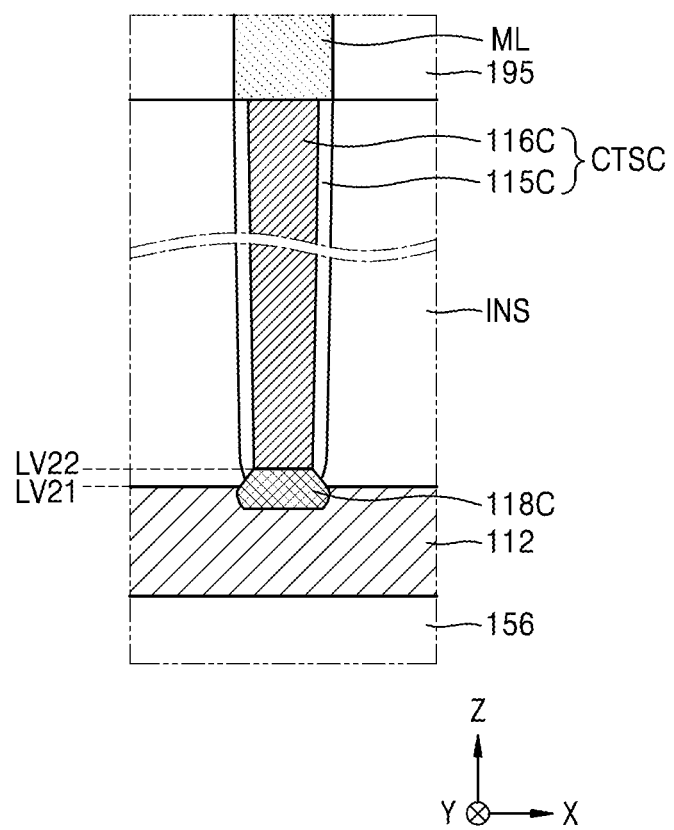

FIGS. 7A through 7C are cross-sectional views of modified examples of semiconductor devices, according to different embodiments of the inventive concepts. Each of FIGS. 7A through 7C illustrates an enlarged cross-sectional configuration of a portion corresponding to the local region EX1 in FIG. 5A. In FIGS. 7A and 7C, the same reference numerals as in FIGS. 4 and 5A through 5C may denote the same members, and repeated descriptions thereof are omitted.

Referring to FIG. 7A, a semiconductor device 200A may have substantially the same configuration as that of the semiconductor device 100 described with reference to FIGS. 4 and 5A through 5C. However, the semiconductor device 200A may include a contact structure CTSA extending in the vertical direction (Z direction) on the conductive pad region 112 and a metal silicide layer 118A formed in a connection portion between the contact structure CTSA and the conductive pad region 112.

The contact structure CTSA may include a contact plug 116A extending in the vertical direction (Z direction), and an insulating plug 115A surrounding the contact plug 116A. The contact plug 116A may be connected to the conductive pad region 112 via the metal silicide layer 118A.

The contact structure CTSA may extend into the conductive pad region 112 to a vertical level lower than the vertical level of the upper surface of the conductive pad region 112, and the metal silicide layer 118A may be spaced apart from the upper surface and the lower surface of the conductive pad region 112. Accordingly, the lowest surface of the metal silicide layer 118A may be spaced apart from the lower surface of the conductive pad region 112. The vertical level of the uppermost surface of the metal silicide layer 118A may be lower than the vertical level of the upper surface of the conductive pad region 112, and a vertical level of the lowermost surface of the metal silicide layer 118A may be higher than the vertical level of the lower surface of the conductive pad region 112. The metal silicide layer 118A may contact a bottom surface of the contact plug 116A at a vertical level lower than the vertical level of the upper surface of the conductive pad region 112. In some example embodiments, and as illustrated in FIG. 7A, the insulating plug 115A may not contact the metal silicide layer 118A.

A width W2 of the metal silicide layer 118A in a horizontal direction (for example, X direction) may be less than a width W1 of the contact structure CTSA. A height of the metal silicide layer 118A in the vertical direction (Z direction) may be less than a height of the conductive pad region 112.

Referring to FIG. 7B, a semiconductor device 200B may have substantially the same configuration as that of the semiconductor device 100 described with reference to FIGS. 4 and 5A through 5C. However, the semiconductor device 200B may include a contact structure CTSB extending in the vertical direction (Z direction) on the conductive pad region 112, and a metal silicide layer 118B formed in a connection portion between the contact structure CTSB and the conductive pad region 112.

The contact structure CTSB may include a contact plug 116B extending in the vertical direction (Z direction), and an insulating plug 115B surrounding the contact plug 116B. The contact plug 116B may be connected to the conductive pad region 112 via the metal silicide layer 118B.

The contact structure CTSB and the metal silicide layer 118B may extend into the conductive pad region 112 to a vertical level lower than the vertical level of the upper surface of the conductive pad region 112. A vertical distance DR2 from the upper surface of the conductive pad region 112 to the lowest surface of the contact structure CTSB may be less than a thickness of the conductive pad region 112 in the vertical direction (Z direction). The metal silicide layer 118B may contact the upper and lower surfaces of the conductive pad region 112. A vertical level of the uppermost surface of the metal silicide layer 118B may be approximately the same as or similar to the vertical level of the upper surface of the conductive pad region 112, and a vertical level of the lowermost surface of the metal silicide layer 118B may be approximately the same as or similar to the vertical level of the lower surface of the conductive pad region 112. Accordingly, a height of the metal silicide layer 118B in the vertical direction (Z direction) may be approximately the same as or similar to a height of the conductive pad region 112. The metal silicide layer 118B may contact the upper and lower surfaces of the conductive pad region 112.

The metal silicide layer 118B may contact a bottom surface of the contact plug 116B at a vertical level lower than the vertical level of the upper surface of the conductive pad region 112. The insulating plug 115B may include a portion between a lower end of the contact plug 116B and the metal silicide layer 118B.

Referring to FIG. 7C, a semiconductor device 200C may have substantially the same configuration as that of the semiconductor device 100 described with reference to FIGS. 4 and 5A through 5C. However, the semiconductor device 200C may include a contact structure CTSC extending in the vertical direction (Z direction) on the conductive pad region 112, and a metal silicide layer 118C formed in a connection portion between the contact structure CTSC and the conductive pad region 112.

The contact structure CTSC may include a contact plug 116C extending in the vertical direction (Z direction), and an insulating plug 115C surrounding the contact plug 116C. The contact plug 116C may be connected to the conductive pad region 112 via the metal silicide layer 118C.

The metal silicide layer 118C may extend into the conductive pad region 112 to a vertical level lower than the vertical level of the upper surface of the conductive pad region 112. The contact structure CTSC may be spaced apart from the conductive pad region 112 in the vertical direction (Z direction). A vertical level LV21 of the upper surface of the conductive pad region 112 may be lower than a vertical level LV22 of the lower surface of the contact plug 116C constituting the contact structure CTSC.

In the vertical direction (Z direction), the lowest surface of the metal silicide layer 118C may be at a level lower than the uppermost surface of the conductive pad region 112, and the uppermost surface of the metal silicide layer 118C may be at a level higher than the uppermost surface of the conductive pad region 112. The vertical level of the lowermost surface of the metal silicide layer 118C may be higher than the vertical level of the lower surface of the conductive pad region 112. The metal silicide layer 118C may contact a bottom surface of the contact plug 116C at a vertical level higher than the vertical level of the upper surface of the conductive pad region 112. The metal silicide layer 118C may contact the upper surface of the conductive pad region 112.

FIG. 8A illustrates cross-sectional views of modified examples of a semiconductor device 300, according to some embodiments of the inventive concepts, (A) in FIG. 8B is an enlarged cross-sectional view of a local region EX31 in FIG. 8A, and (B) in FIG. 8B is an enlarged cross-sectional view of a local region EX32 in FIG. 8A. In FIGS. 8A and 8B, the same reference numerals as in FIGS. 4 and 5A through 5C may denote the same members, and repeated descriptions thereof are omitted.

Referring to FIGS. 8A and 8B, the semiconductor device 300 may have substantially the same configuration as that of the semiconductor device 100 described with reference to FIGS. 4 and 5A through 5C. However, in the semiconductor device 300, the metal silicide layer 118 may not be between at least one conductive pad region 112 and the at least one contact structure CTS connected to the at least one conductive pad region 112. For example, the metal silicide layer 118 may be absent from between the uppermost conductive pad region 112 (that is, the conductive pad region 112 of the plurality of conductive pad regions 112 that is farthest from the substrate 102), and the at least one contact structure CTS connected to the uppermost conductive pad region 112.

Stated differently, in some example embodiments, and as seen in FIGS. 8A and 8B, at least one conductive pad region 112 of the plurality of contact pad regions 112 may directly contact the contact plug 116 of the contact structure CTS connected thereto, without an intervening metal silicide layer 118.

In the semiconductor device 300, the conductive pad region 112, facing the contact structure CTS with the metal silicide layer 118 therebetween, of the plurality of conductive pad regions 112 may be at a lower vertical level than the uppermost conductive pad region 112. Accordingly, a vertical distance from the conductive pad region 112 facing the contact structure CTS to the substrate 102 with the metal silicide layer 118 therebetween (that is, a Z-direction distance) may be less than a vertical distance from the uppermost conductive pad region 112 to the substrate 102.

FIG. 9 is a cross-sectional view of a semiconductor device 400 according to some embodiments of the inventive concepts. In FIG. 9, the same reference numerals as in FIGS. 4 and 5A through 5C may denote the same members, and repeated descriptions thereof are omitted.

Referring to FIG. 9, the semiconductor device 400 may include a memory cell array MCA4 formed on the active region AC of the memory cell region MEC. The memory cell array MCA4 may include a lower memory stack STA and an upper memory stack STB, which may overlap the substrate 102 in the vertical direction (Z direction). The upper memory stack STB may be spaced apart from the substrate 102 with the lower memory stack STA therebetween.

A lower gate stack GSA may be in the memory cell region MEC and the connection region CON of the substrate 102. The lower gate stack GSA may include a plurality of lower gate lines GL1 and a plurality of conductive pad regions 112 integrally connected to the plurality of lower gate lines GL1. A portion of the lower gate stack GSA in the memory cell region MEC may constitute a lower memory stack STA. The plurality of conductive pad regions 112 may be in the connection region CON and may constitute the stepped connection unit 110.

The upper gate stack GSB may be above the lower gate stack GSA. The upper gate stack GSB may include a plurality of upper gate lines GL2 and a plurality of conductive pad regions 122 integrally connected to the plurality of upper gate lines GL2. A portion of the upper gate stack GSB in the memory cell region MEC may constitute the upper memory stack STB. The plurality of conductive pad regions 122 may be in the connection region CON, and may constitute a stepped connection unit 120.

The lower memory stack STA may include 48, 64, or 96 lower gate lines GL1 stacked to overlap each other in the vertical direction (Z direction), and the upper memory stack STB may include 48, 64, or 96 upper gate lines GL2 stacked to overlap each other in the vertical direction (Z direction), but the present disclosure is not limited thereto. In some example embodiments, a sum of the number of lower gate lines GL1 and the number of upper gate lines GL2 may be at least 128.

The plurality of lower gate lines GL1 and the plurality of upper gate lines GL2 may include the first through $n^{th}$ word lines WL1 through WLn, at least one ground select line GSL, and at least one string select line SSL. FIG. 9 illustrates a case in which two ground select lines GSL and two string select lines SSL are included in the plurality of lower gate lines GL1 and the plurality of upper gate lines GL2, however, the present disclosure is not limited thereto. A more detailed configuration of the plurality of lower gate lines GL1 and the plurality of upper gate lines GL2 may be the same as that described for the gate line GL with reference to FIGS. 5A and 5B.

A plurality of insulating layers 156A and 156B may be alternately stacked with the substrate 102, the ground select lines GSL, the first through $n^{th}$ word lines WL1 through WLn, and the string select lines SSL. In other words, an insulating layer 156A, 156B may be above and below each ground select line GSL, each word line WL1 through WLn, and each string select line SSL. An insulating layer 156 may be between pairs of adjacent gate lines GL of the plurality of lower gate lines GL1 and the plurality of upper gate lines GL2. The plurality of insulating layers 156A and 156B on the substrate 102 may include the plurality of insulating layers 156A constituting the lower memory stack STA and the plurality of insulating layers 156B constituting the upper memory stack STB. An insulating layer 156A closest to the substrate 102 of the plurality of insulating layers 156A constituting the lower memory stack STA may have a thickness less than a thickness of the other insulating layers 156A. The insulating layer 156B farthest from the substrate 102 of the plurality of insulating layers 156B constituting the upper memory stack STB may cover an upper surface of the string select line SSL that is farthest from the substrate 102. The plurality of insulating layers 156A and 156B may include silicon oxide, silicon nitride, or SiON, as examples.

The interlayer insulating layer 130 and the isolation insulating layer 140 may be between the lower memory stack STA and the upper memory stack STB. The interlayer insulating layer 130 and the isolation insulating layer 140 may each include a silicon oxide layer.

In the memory cell region MEC, a plurality of channel structures 180A and 180B may penetrate the plurality of lower gate lines GL1, the plurality of insulating layers 156A, the interlayer insulating layer 130, the isolation insulating layer 140, the plurality of upper gate lines GL2, and the plurality of insulating layers 156B, and extend in the vertical direction (Z direction). The plurality of channel structures 180A and 180B may be spaced apart from each other with a certain interval therebetween in the X and Y directions. The certain intervals may be different in different directions.

Each of the plurality of channel structures 180A and 180B may include the lower channel structure 180A penetrating the plurality of lower gate lines GL1, and the upper channel structure 180B penetrating the plurality of upper gate lines GL2. The lower channel structure 180A and the upper channel structure 180B may each include the gate dielectric layer 182, the channel region 184, the buried insulating layer 186, and the drain region 188.

The plurality of drain regions 188 constituting the plurality of lower channel structures 180A may be insulated from each other by a lower intermediate insulating layer 187A, and the plurality of drain regions 188 constituting the plurality of upper channel structures 180B may be insulated from each other by an upper intermediate insulating layer 187B. The lower intermediate insulating layer 187A and the upper intermediate insulating layer 187B may each include an oxide layer, a nitride layer, or a combination thereof. A lower surface of the upper channel structure 180B may contact an upper surface of the lower channel structure 180A. For example, the upper channel surface 180B may contact the drain region 188 of the lower channel structure 180A. In the horizontal direction, a width of the lower surface of the upper channel structure 180B may be less than a width of the upper surface of the lower channel structure 180A. A more detailed configuration of each of the plurality of lower channel structures 180A and each of the plurality of upper channel structures 180B may be substantially the same as that described for the plurality of channel structures 180 with reference to FIGS. 4 and 5A and 5B.

In the connection region CON, each of the plurality of conductive pad regions 112 constituting the stepped connection unit 110 and each of the plurality of conductive pad regions 122 constituting the stepped upper connection portion 120 may have a length in the first horizontal direction (X direction) that gradually decreasing as a distance from the substrate 102 increases. In other words, a first conductive pad region 112 between an uppermost conductive pad region 112 (farthest from the substrate 102) and a lowermost pad region 112 (closest to the substrate 102) may be longer than a second conductive pad region 112 above the first conductive pad region 112 in the vertical direction (Z direction).

In example embodiments, a plurality of dummy channel structures (not illustrated) penetrating the stepped connection unit 110 and the stepped connection unit 120 may be in the connection region CON. The plurality of dummy channel structures may support edge portions of each of the plurality of lower gate lines GL1 and the plurality of upper gate lines GL2, and the plurality of conductive pad regions 112 and the plurality of conductive pad regions 122, and accordingly, may prevent an occurrence of unwanted structural deformation, such as bending or breaking thereof.

In the memory cell region MEC, the plurality of bit lines BL may be above the memory stack ST. A plurality of bit line contact pads 194 may be between the plurality of upper channel structures 180B and the plurality of bit lines BL. The drain region 188 of each of the plurality of channel structures 180 (and more specifically, the drain region 188 of the upper channel structures 180B) may be connected to a respective bit line BL of the plurality of bit lines BL via the bit line contact pad 194.

In the connection region CON, an insulating layer 114 covering the stepped connection unit 110 may be between the substrate 102 and the lower intermediate insulating layer 187A. The insulating layer 114 may cover the plurality of conductive pad regions 112 and the insulating layer 156A. An upper insulating layer 124 covering the stepped upper connecting portion 120 may be between the isolation insulating layer 140 and the upper intermediate insulating layer 187B. The upper insulating layer 124 may cover the plurality of conductive pad regions 122 and the insulating layer 156B.

In the connection region CON, a plurality of contact structures CTS extending in the vertical direction (Z direction) may be on the plurality of conductive pad regions 112 constituting the stepped connection unit 110, and may be on the plurality of conductive pad regions 122 constituting the stepped upper connection portion 120. A metal silicide layer 118 may be between the plurality of contact structures CTS and the plurality of conductive pad regions 112, and between the plurality of contact structures CTS and the plurality of conductive pad regions 122. Each of the plurality of contact structures CTS may include a contact plug 116 extending in the vertical direction (Z direction), and an insulating plug 115 surrounding the contact plug 116. The contact plug 116 of each of the plurality of contact structures CTS may be connected to the conductive pad regions 112 and 122 via the plurality of metal silicide layers 118. More detailed configurations and various modifications of the connection portions between the plurality of conductive pad regions 112 and 122, the plurality of metal silicide layers 118, and the plurality of contact structures CTS may be substantially the same as those, described with reference to FIGS. 5A through 5C, and 7A through 7C, of the connection portions between the metal silicide layers 118, 118A, 118B, and 118C, the conductive pad region 112, and the contact structures CTS, CTSA, CTSB, and CTSC.

In some example embodiments, similar to the description given with reference to the semiconductor device 400 of FIGS. 8A and 8B, the metal silicide layer 118 may not be at connection portions between at least one conductive pad region 112, 122 and the contact structure CTS connected to the at least one conductive pad region 112, 122. For example, the metal silicide layer 118 may not be between an uppermost conductive pad region 122 farthest from the substrate 102 and the contact structure CTS connected to the uppermost conductive pad 122.

Each of the plurality of contact structures CTS, connected to a respective conductive pad region 112 of the plurality of conductive pad regions 112 of the stepped connection unit 110, may extend in a vertical direction from the respective conductive pad region 112 to a first vertical level LV41 that is higher than the lower memory stack STA and lower than the upper memory stack STB. At least some of the plurality of contact structures CTS may penetrate the insulating layer 114 and the lower intermediate insulating layer 187A from the conductive pad region 112. The contact structure CTS connected to the uppermost conductive pad region 112 farthest from the substrate 102 may penetrate the insulating layer 156A and the lower intermediate insulating layer 187A from the conductive pad region 112, and may extend to the first vertical level LV41 without penetrating the insulating layer 114.

A plurality of lower wiring layers MA may be on the plurality of lower contact plugs 116. The plurality of lower wiring layers MA may be connected to the plurality of contact structures CTS, and extend in the horizontal direction at the first vertical level LV41. The plurality of lower wiring layers MA may be electrically connected to at least one lower gate line GL1 of the plurality of lower gate lines GL1 via the plurality of contact structures CTS. In the connection region CON, the plurality of lower wiring layers MA may be insulated from each other by the interlayer insulating layer 130.

Each of the plurality of contact structures CTS, connected to a respective conductive pad region 122 of the plurality of conductive pad regions 122 of the stepped upper connection portion 120, may extend in a vertical direction from the respective conductive pad region 122 to a second vertical level LV42 higher than the upper memory stack STB. At least some of the plurality of contact structures CTS may penetrate the upper insulating layer 124, the upper intermediate insulating layer 187B, and the insulating layer 193, from the conductive pad region 122. The contact structure CTS, connected to the uppermost conductive pad region 122 farthest from the substrate 102 may penetrate the insulating layer 156B, the upper intermediate insulating layer 187B, and the insulating layer 193 from the conductive pad region 122, and may extend to the second vertical level LV42 without penetrating the upper insulating layer 124. The second vertical level LV42 may be higher than a level of the uppermost surface of the plurality of upper channel structures 180B penetrating the upper memory stack STB.

A plurality of upper wiring layers MB may be on the plurality of contact structures CTS connected to the plurality of conductive pad regions 122. The plurality of upper wiring layers MB may be connected to the plurality of contact structures CTS and extend in the horizontal direction along the second vertical level LV42. The plurality of upper wiring layers MB may be electrically connected to at least one upper gate line GL2 of the plurality of upper gate lines GL2 via the plurality of contact structures CTS and the metal silicide layer 118. The plurality of upper wiring layers MB in the connection region CON may be formed at the same level as the plurality of bit lines BL in the memory cell region MEC. The plurality of upper wiring layers MB in the connection region CON may be insulated from each other by the upper interlayer insulating layer 195.

In some example embodiments, and differing from that illustrated in FIG. 9, each of the plurality of contact structures CTS, connected to the plurality of conductive pad regions 112 of the stepped connection unit 110, may penetrate the insulating layer 114, the lower intermediate insulating layer 187A, the intermediate insulating layer 130, the separation insulating layer 140, the upper insulating layer 124, the upper intermediate insulating layer 187B, and the insulating layer 193, and may extend from the respective conductive pad region 112 to the second vertical level LV42. In this case, some of the plurality of upper wiring layers MB may be electrically connected to at least one lower gate line GL1 of the plurality of lower gate lines GL1 via the plurality of contact structures CTS and the metal silicide layer 118, and the plurality of lower wiring layers MA may be omitted.

The plurality of contact structures CTS, the plurality of lower wiring layers MA, and the plurality of upper wiring layers MB may each include tungsten, titanium, tantalum, copper, aluminum, titanium nitride, tantalum nitride, tungsten nitride, or a combination thereof.

A plurality of circuits CT4 may be formed in the periphery circuit region PERI. The plurality of circuits CT4 may be formed at a vertical level equal to or higher than the vertical level of the substrate 102. A more detailed configuration for the plurality of circuits CT4 may be substantially the same as the description given for the plurality of circuits CT with reference to FIG. 5.

The plurality of periphery contact structures PTS1 may be in the periphery circuit region PERI. A plurality of lower periphery contact structures PTS1 may penetrate the insulating layer 114 from the periphery transistor TR, and extend in the vertical direction (Z direction) to the first vertical level LV41. Each of the plurality of lower periphery contact structures PTS1 may include the periphery contact plug P116 extending in the vertical direction (Z direction), and the periphery insulating plug P115 surrounding the periphery contact plug P116.

A plurality of lower periphery wiring layers PMA connected to the plurality of lower periphery contact structures PTS1 may be on the plurality of lower periphery contact structures PTS1. The plurality of lower periphery wiring layers PMA may extend in the horizontal direction at the first vertical level LV41. Each of the plurality of lower periphery wiring layers PMA may be connected to one of the periphery gate PG or the periphery source/drain regions PSD via a respective one of the plurality of lower periphery contact structures PTS1. At least some of the plurality of lower periphery wiring layers PMA may be connected to other circuits or wirings in the periphery circuit region PERI. The plurality of lower periphery wiring layers PMA may be insulated from each other by the interlayer insulating layer 130.

A plurality of upper periphery contact structures PTS2 connected to the plurality of lower periphery wiring layers PMA may be on the plurality of lower periphery wiring layers PMA. The plurality of upper periphery contact structures PTS2 may penetrate the isolation insulating layer 140 and the upper insulating layer 124 from the plurality of lower periphery wiring layers PMA, and may extend to the second vertical level LV42. Each of the plurality of lower periphery contact structures PTS2 may include the periphery contact plug P116 extending in the vertical direction (Z direction), and the periphery insulating plug P115 surrounding the periphery contact plug P116.

A plurality of upper periphery wiring layers PMB connected to the plurality of upper periphery contact structures PTS2 may be on the plurality of upper periphery contact structures PTS2. The plurality of upper periphery wiring layers PMB may extend in the horizontal direction at the second vertical level LV42 that is the same level as the level of the plurality of upper wiring layers MB formed in the connection region CON. Each of the plurality of upper periphery wiring layers PMB may be connected to other circuits or wirings in the periphery circuit region PERI. The plurality of upper periphery wiring layers PMB may be insulated from each other by the interlayer insulating layer 195.

The plurality of lower periphery wiring layers PMA and the plurality of upper periphery wiring layers PMB may each include tungsten, titanium, tantalum, copper, aluminum, titanium nitride, tantalum nitride, tungsten nitride, or a combination thereof.

FIG. 10 is a cross-sectional view of a semiconductor device 500A according to some embodiments of the inventive concepts.

Referring to FIG. 10, the semiconductor device 500A may have substantially the same configuration as that of the semiconductor device 100 described with reference to FIGS. 4 and 5A through 5C. However, the semiconductor device 500A may include a periphery circuit region PERI5 formed at a level lower than the level of the substrate 102.

The memory cell region MEC and the connection region CON may vertically overlap the periphery circuit region PERI5. In the connection region CON, the plurality of contact structures CTS extending in the vertical direction (Z direction) may be on the plurality of conductive pad regions 112 of the stepped connection unit 110. The plurality of metal silicide layers 118 may be at a plurality of connection portions between the plurality of contact structures CTS and the plurality of conductive pad regions 112.

The periphery circuit region PERI5 may include a periphery circuit board 502 under the substrate 102, and a plurality of circuits CT5 between the periphery circuit board 502 and the substrate 102. The memory cell region MEC and the connection region CON may be on a first surface of the substrate 102 and the periphery circuit region PERI5 may be on a second surface of the substrate 102 opposite from the first surface. More detailed configurations of the periphery circuit board 502 and the circuit CT5 may be substantially the same as descriptions given for the substrate 102 and the plurality of circuits CT with reference to FIGS. 5A and 5B.

A periphery circuit active region PACS may be defined on the periphery circuit board 502 by an element isolation layer 504. A plurality of transistors TR5 may be formed on the periphery circuit active region PACS. Each of the plurality of transistors TR5 may include a periphery gate PG5 and a periphery source/drain region PSD5 formed in the periphery active region PACS on both sides of the periphery gate PG5. In some example embodiments, unit elements such as a resistor and a capacitor may be further arranged in the periphery circuit region PERI5. A periphery interlayer insulating layer 510 may be formed on the plurality of transistors TR5. The periphery interlayer insulating layer 510 may include silicon oxide, SiON, SiOCN, or the like.

The periphery circuit region PERI5 may include a plurality of periphery circuit wiring layers 508 and a plurality of periphery circuit contacts 509. Some of the plurality of periphery circuit wiring layers 508 may be electrically connected to the plurality of transistors TR5. The plurality of periphery circuit contacts 509 may connect some periphery circuit wiring layers 508, of the plurality of periphery circuit wiring layers 508, to each other. The plurality of periphery circuit wiring layers 508 and the plurality of periphery circuit contacts 509 may be covered with the periphery interlayer insulating layer 510. Some of the plurality of periphery circuit wiring layers 508 may face the memory stack ST with the substrate 102 therebetween.

The plurality of periphery circuit wiring layers 508 and the plurality of periphery circuit contacts 509 may each include a metal, conductive metal nitride, metal silicide, or a combination thereof. For example, the plurality of periphery circuit wiring layers 508 and the plurality of periphery circuit contacts 509 may include a conductive material such as tungsten, molybdenum, titanium, cobalt, tantalum, nickel, tungsten silicide, titanium silicide, cobalt silicide, tantalum silicide, and nickel silicide. In FIG. 10, it is illustrated that the plurality of periphery circuit wiring layers 508 have a three-layer wiring structure in the vertical direction (Z direction), but the present disclosure is not limited thereto. For example, the plurality of periphery circuit wiring layers 508 may have a multi-layer wiring structure of two, or four or more layers.

In the semiconductor device 500A, a through hole 102H may be formed in the substrate 102. The through hole 102H may be filled with a substrate buried insulating layer 512. The substrate filling insulating layer 512 may include a silicon oxide layer.

In the semiconductor device 500A, wiring structures in the connection region CON may be electrically connected to the plurality of periphery circuit wiring layers 508 in the periphery circuit region PERI5 via the periphery contact structure PTS5 extending in the vertical direction (Z direction). The periphery contact structure PTS5 may include a periphery contact plug P116 extending in the vertical direction (Z direction), and a periphery insulating plug P115 surrounding the periphery contact plug P116. At least some of the plurality of wiring layers ML in the connection region CON and the periphery wiring layer PML may be electrically connected to the plurality of periphery circuit wiring layers 508 in the periphery circuit region PERI5 via the periphery contact structure PTS5.

The periphery contact structure PTS5 may penetrate the periphery interlayer insulating layer 510 and the substrate buried insulating layer 512 from one periphery circuit wiring layer 508 of the plurality of periphery circuit wiring layers 508, and may extend to the periphery wiring layer PML in the vertical direction (Z direction). The periphery contact structure PTS5 may penetrate the substrate 102 via the through hole 102H, and may be surrounded by the substrate buried insulating layer 512 in the through hole 102H.

FIG. 11 is a cross-sectional view of a semiconductor device 500B according to some embodiments of the inventive concepts. In FIG. 11, the same reference numerals as in FIGS. 5A, 5B, and 10 may denote the same members, and repeated descriptions thereof are omitted.

Referring to FIG. 11, the semiconductor device 500B may have substantially the same configuration as that described with respect to the semiconductor device 500A with reference to FIG. 10. However, the semiconductor device 500B may further include the metal silicide layer P118 formed at a connection portion between the periphery contact structure PTS5, and the periphery circuit wiring layer 508 to which the periphery contact structure PTS5 is connected. The periphery contact structure PTS5 may be connected to the periphery circuit wiring layer 508 via the metal silicide layer P118. The metal silicide layer P118 may have substantially the same configuration as descriptions given for the metal silicide layer 118 with reference to FIGS. 5A through 5C.

In some embodiments, a metal included in the metal silicide layer P118 may be the same as a metal included in the periphery contact structure PTS5. In some other embodiments, the metal included in the metal silicide layer P118 and the metal included in the periphery contact structure PTS5 may be different metals from each other.

A more detailed configuration and various modifications of the metal silicide layer P118, the periphery circuit wiring layer 508 in contact with the metal silicide layer P118, and the connection portions between the periphery contact structures PTS5 may be substantially the same as descriptions given for the metal silicide layers 118, 118A, 118B, and 118C, the conductive pad region 112, and the connection portions between the contact structures CTS, CTSA, CTSB, and CTSC with reference to FIGS. 5A through 5C, and 7A through 7C.

FIG. 12 is a cross-sectional view of a semiconductor device 600 according to some embodiments of the inventive concepts. In FIG. 12, the same reference numerals as in FIGS. 5A, 5B, and 10 may denote the same members, and repeated descriptions thereof are omitted.

Referring to FIG. 12, the semiconductor device 600 may have a chip to chip (C2C) structure. The C2C structure may mean a structure in which, after an upper chip including a cell region CELL is manufactured on a first wafer, and a lower chip including the periphery circuit region PERI is manufactured on a second wafer different from the first wafer, the upper chip and the lower chip are connected to each other by using a bonding method. For example, the bonding method may include a method of electrically bonding a bonding metal formed on the uppermost metal layer of the upper chip including the cell region CELL to a bonding metal formed on the uppermost metal layer of the lower chip including the periphery circuit region PERI. In some example embodiments, when the bonding metal includes copper (Cu), the bonding method may include a Cu—Cu bonding method. In other example embodiments, the bonding metal may include aluminum or tungsten.

In the semiconductor device 600, the periphery circuit region PERI and the cell region CELL may each include the pad bonding area PA. The cell region CELL may further include the connection region CON and the memory cell region MEC.

The periphery circuit region PERI may include a first substrate 610, an interlayer insulating layer 615, a plurality of circuit elements 620a, 620b, and 620c formed on the first substrate 610, and first metal layers 630a, 630b, and 630c respectively connected to a plurality of circuit elements 620a, 620b, and 620c, and second metal layers 640a, 640b, and 640c respectively formed on the first metal layers 630a, 630b, and 630c. In some example embodiments, the first metal layers 630a, 630b, and 630c may include tungsten, and the second metal layers 640a, 640b, and 640c may include Cu.

In some example embodiments, at least one metal layer may be further formed on the second metal layers 640a, 640b, and 640c. At least some of the at least one metal layer formed on the second metal layers 640a, 640b, and 640c may include aluminum.

The interlayer insulating layer 615 may cover the plurality of circuit elements 620a, 620b, and 620c, the first metal layers 630a, 630b, and 630c, and the second metal layers 640a, 640b, and 640c. The interlayer insulating layer 615 may include silicon oxide, silicon nitride, or a combination thereof.

Lower bonding metals 671b and 672b may be on the second metal layer 640b in a region where the lower bonding metals 671b and 672b overlap the connection region CON in the periphery circuit region PERI in the vertical direction (Z direction). In the connection region CON, the lower bonding metals 671b and 672b of the periphery circuit region PERI may be electrically connected to the upper bonding metals 371b and 372b of the cell region CELL by using the bonding method. The lower bonding metals 671b and 672b and the upper bonding metals 371b and 372b may include aluminum, Cu, or tungsten.

The cell region CELL may include a second substrate 310 and a common source line 320. The gate stack GS including the plurality of gate lines GL and the plurality of conductive pad regions 112 connected to the plurality of gate lines GL may be on the second substrate 310. In the cell region CELL, detailed configurations of structures in the connection region CON and the memory cell region MEC may be the same as descriptions given with reference to FIGS. 5A through 5C.

In the memory cell region MEC, the channel structure 180 may be connected to the upper bonding metals 371c and 372c via the bit line contact pad 194 and the bit line BL. The bit line BL may be electrically connected to a circuit element included in the periphery circuit region PERI, for example, a circuit element 620c providing a page buffer 393 via the upper bonding metals 371c and 372c. The upper bonding metals 371c and 372c may be connected to the lower bonding metals 671c and 672c, which are connected to the circuit element 620c of the page buffer 393.

In the connection region CON, each of the plurality of conductive pad regions 112 may extend in a direction parallel with the upper surface of the second substrate 310, and may be connected to the contact structure CTS via the metal silicide layer 118. In each of the plurality of contact structures CTS, a second end opposite to a first end connected to the metal silicide layer 118 may be connected to the upper bonding metals 371b and 372b. The plurality of contact structures CTS may be connected to the periphery circuit region PERI via the upper bonding metals 371b and 372b of the cell region CELL and the lower bonding metals 671b and 672b of the periphery circuit region PERI.

Each of the contact structures CTS may be electrically connected to the circuit element 620b providing the row decoder 394 in the periphery circuit region PERI. In example embodiments, an operating voltage of the circuit element 620b providing the row decoder 394 may be different from an operating voltage of the circuit element 620c providing the page buffer 393. For example, the operating voltage of the circuit element 620c providing the page buffer 393 may be greater than the operating voltage of the circuit element 620b providing the row decoder 394.

A plurality of common source line contact plugs 380 may be in the pad bonding area PA. Each of the plurality of common source line contact plugs 380 may be electrically connected to the common source line 320. Each of the plurality of common source line contact plugs 380 may include a metal, a metal compound, polysilicon, or a combination thereof. A metal layer 350a may be connected to the other end of the common source line contact plug 380 opposite to one end connected to the common source line 320. The metal layer 350a may be connected to the upper metal patterns 371a and 372a. Each of the upper metal patterns 371a and 372a may be connected to a corresponding one of the lower metal patterns 671a, 672a, and 673a of the periphery circuit region PERI.

A plurality of I/O pads 305 and 605 may be in the pad bonding area PA. A lower insulating layer 601 covering a lower surface of the first substrate 610 may be formed under the first substrate 610, and the first I/O pad 605 may be formed on the lower insulating layer 601. The first I/O pad 605 may be connected to at least one of a plurality of circuit elements 620a, 620b, and 620c in the periphery circuit region PERI via a first I/O contact plug 603 penetrating the lower insulating layer 201 and the first substrate 610. An insulating layer 612 may be between the first I/O contact plug 603 and the first substrate 610, and may electrically separate the first I/O contact plug 603 from the first substrate 610.

An upper insulating layer 301 covering the upper surface of the second substrate 310 may be on the second substrate 310. The second I/O pad 305 may be on the upper insulating layer 301. The second I/O pad 305 may be connected to at least one of the plurality of circuit elements 620a, 620b, and 620c in the periphery circuit region PERI via the second I/O contact plug 303.

The second I/O contact plug 303 may be apart from the second substrate 310 and the common source line 320. The second input/output pad 305 may not overlap the plurality of conductive pad regions 112 in the vertical direction (Z direction). The second I/O contact plug 303 may penetrate the interlayer insulating layer 315 and the upper insulating layer 301, and may be connected to the second I/O pad 305.

In some example embodiments, any one of the first I/O pad 605 and the second I/O pad 305 may be omitted.

In the pad bonding area PA, the upper metal patterns 371a and 372a formed on the uppermost metal layer of the cell region CELL may be connected to corresponding lower metal patterns 671a, 672a, and 673a formed on the uppermost metal layer of the periphery circuit region PERI. The lower metal pattern 673a formed on the uppermost metal layer of the periphery circuit region PERI may not be connected to a separate contact in the periphery circuit region PERI. In some embodiments, in response to the lower metal pattern formed on the uppermost metal layer of the periphery circuit region PERI in the pad bonding area PA, an upper metal pattern having the same shape as the lower metal pattern of the periphery circuit region PERI may be formed on the upper metal layer of the cell region CELL.

The lower bonding metals 671b and 672b may be formed on the second metal layer 640b of the connection region CON. The lower bonding metals 671b and 672b may be electrically connected to the upper bonding metals 371b and 372b of the cell region CELL by using a bonding method.

In the memory cell region MEC, an upper metal pattern 392 may be on the uppermost metal layer of the cell region CELL in correspondence to lower bonding metals 651 and 652 formed on the uppermost metal layer of the periphery circuit region PERI.

According to the semiconductor devices 100, 200A, 200B, 200C, 300, 400, 500A, 500B, and 600 with reference to FIGS. 4 through 12, contact resistance between a conductive pad region and a contact plug may be reduced by forming a metal silicide layer at a connection portion between the conductive pad region and the contact plug connected to the conductive pad region, even though, in a semiconductor device including three-dimensionally arranged memory cells, the number of layers of a word line is increased, and the number of contacts and the number of wirings connected to the word line are increased to improve a degree of integration. Therefore, it is possible to maintain good electrical characteristics in the semiconductor device, and improve the reliability of the semiconductor device.

FIG. 13 is a schematic diagram of an electronic system 1000 including a semiconductor device 1100, according to some embodiments of the inventive concepts.

Referring to FIG. 13, the electronic system 1000 according to some example embodiments of the inventive concepts may include the semiconductor device 1100 and a controller 1200 electrically connected to the semiconductor device 1100. The electronic system 1000 may include a storage device including one or more semiconductor devices 1100, or an electronic device including the storage device. For example, the electronic system 1000 may include a solid state drive device (SSD) including at least one semiconductor device 1100, a universal serial bus (USB), a computing system, a medical device, or a communication device.

The semiconductor device 1100 may include a nonvolatile memory device. For example, the semiconductor device 1100 may include a NAND flash memory device including at least one of the structures described above for the semiconductor devices 100, 200A, 200B, 200C, 300, 400, 500A, 500B, and 600 with reference to FIGS. 4 through 12. The semiconductor device 1100 may include a first structure 1100F and a second structure 1100S on the first structure 1100F. In example embodiments, the first structure 1100F may be next to the second structure 1100S. The first structure 1100F may include a periphery circuit structure including a decoder circuit 1110, a page buffer 1120, and a logic circuit 1130. The second structure 1100S may include a memory cell structure including the bit line BL, the common source line CSL, the plurality of word lines WL, a first upper gate line UL1 and a second upper gate line UL2, a first lower gate line LL1 and a second lower gate line LL2, and the plurality of memory cell strings CSTR between the bit line BL and the common source line CSL.

In the second structure 1100S, each of the plurality of memory cell strings CSTR may include lower transistors LT1 and LT2 adjacent to the common source line CSL, and upper transistors UT1 and UT2 adjacent to the bit line BL, and the plurality of memory cell transistors MCT between the lower transistors LT1 and LT2 and the upper transistors UT1 and UT2. The number of lower transistors LT1 and LT2 and the number of upper transistors UT1 and UT2 may be variously modified according to example embodiments.

In some example embodiments, the upper transistors UT1 and UT2 may include the string select transistor SST, and the lower transistors LT1 and LT2 may include the ground select transistor GST. Each of the plurality of lower gate lines LL1 and LL2 may include gate electrodes of the lower transistors LT1 and LT2, respectively. The word line WL may include a gate electrode of the memory cell transistor MCT, and the upper gate lines UL1 and UL2 may be gate electrodes of the upper transistors UT1 and UT2, respectively.

The common source line CSL, the plurality of lower gate lines LL1 and LL2, the plurality of word lines WL, and the plurality of upper gate lines UL1 and UL2 may be electrically connected to the decoder 1110 via a plurality of first connection wirings 1115 extending to the second structure in the first structure 1100F. The plurality of bit lines BL may be electrically connected to the page buffer 1120 via a plurality of second connection wires 1125 extending to the second structure 1100S in the first structure 1100F.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 via an I/O pad 1101 electrically connected to the logic circuit 1130. The I/O pad 1101 may be electrically connected to the logic circuit 1130 via an I/O connection line 1135 extending to and/or through the second structure 1100S from the first structure 1100F.

The controller 1200 may include a processor 1210, a NAND controller 1220, and a host interface 1230. According to some embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to a certain firmware, and may access the semiconductor device 1100 by controlling the NAND controller 1220. The NAND controller 1220 may include a NAND interface 1221 that processes communication with the semiconductor device 1100. Via the NAND interface 1221, a control command for controlling the semiconductor device 1100, data to be written to the plurality of memory cell transistors MCT of the semiconductor device 1100, data to be read from the plurality of memory cell transistors MCT of the semiconductor device 1100, or the like may be transmitted. The host interface 1230 may provide a communication function between the electronic system 1000 and an external host (not shown). When a control command is received from the external host via the host interface 1230, the processor 1210 may control the semiconductor device 1100 in response to the control command.

FIG. 14 is a schematic perspective diagram of an electronic system 2000 including a semiconductor device, according to some embodiments of the inventive concepts.

Referring to FIG. 14, the electronic system 2000 according to some example embodiments of the inventive concepts may include a main substrate 2001, a controller 2002 mounted on the main substrate 2001, one or more semiconductor packages 2003, and a DRAM 2004. The semiconductor package 2003 and the DRAM 2004 may be connected to the controller 2002 by a plurality of wiring patterns 2005 formed on the main substrate 2001.

The main substrate 2001 may include a connector 2006 including a plurality of pins coupled to an external host (not shown). The number and arrangement of the plurality of pins in the connector 2006 may vary according to a communication interface between the electronic system 2000 and the external host. In example embodiments, the electronic system 2000 may communicate with the external host according to any one of a plurality of interfaces such as a USB interface, a peripheral component interconnect (PCI) express (PCI-E) interface, a serial advanced technology attachment (SATA) interface, and an M-Phy for universal flash storage (UFS) interface. In example embodiments, the electronic system 2000 may operate by power supplied from the external host via the connector 2006. The electronic system 2000 may further include a power management integrated circuit PMIC that distributes power supplied from the external host to the controller 2002 and the semiconductor package 2003.

The controller 2002 may write data to the semiconductor package 2003, or read data from the semiconductor package 2003, and may improve an operation speed of the electronic system 2000.

The DRAM 2004 may include a buffer memory for reducing a speed difference between the semiconductor package 2003, which is a data storage space, and the external host. The DRAM 2004 included in the electronic system 2000 may also operate as a cache memory, and may provide a space for temporarily storing data in a control operation on the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include a first semiconductor package 2003a and a second semiconductor package 2003b, which are spaced apart from each other. Each of the first and second semiconductor packages 2003a and 2003b may include a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400.

The package substrate 2100 may include a printed circuit board including a plurality of package upper pads 2130. Each of the plurality of semiconductor chips 2200 may include an I/O pad 2210. The I/O pad 2210 may correspond to the I/O pad 1101 in FIG. 13. Each of the plurality of semiconductor chips 2200 may include a plurality of gate stacks 3210 and a plurality of channel structures 3220. Each of the plurality of semiconductor chips 2200 may include at least one of the semiconductor devices 100, 200A, 200B, 200C, 300, 400, 500A, 500B, and 600 with reference to FIGS. 4 through 12.

In some example embodiments, the connection structure 2400 may include a bonding wire electrically connecting the I/O pad 2210 to the package upper pad 2130. Accordingly, in the first and second semiconductor packages 2003a and 2003b, the plurality of semiconductor chips 2200 may be electrically connected to each other by a bonding wire method, and may be electrically connected to the package upper pad 2130 of the package substrate 2100. According to some embodiments, in the first and second semiconductor packages 2003a and 2003b, the plurality of semiconductor chips 2200 may be electrically connected to each other by a connection structure including a through silicon via TSV, instead of the connection structure 2400 of the bonding wire type.

In some example embodiments, the controller 2002 and the plurality of semiconductor chips 2200 may be included in one package. In some example embodiment, the controller 2002 and the plurality of semiconductor chips 2200 may be mounted on a separate interposer substrate different from the main substrate 2001, and the controller 2002 and the plurality of semiconductor chips 2200 may be connected to each other by a wiring formed on the interposer substrate.

FIG. 15 is a schematic cross-sectional view of a semiconductor package 2003, according to some embodiments of the inventive concepts. In FIG. 15, the configuration in the cross-sectional view taken along line II-II' in FIG. 14 is illustrated in more detail.

Referring to FIG. 15, in the semiconductor package 2003, the package substrate 2100 may include a printed circuit board. The package substrate 2100 may include a package substrate body unit 2120, the plurality of package upper pads 2130 (refer to FIG. 14) on an upper surface of the package substrate body unit 2120, a plurality of lower pads 2125 arranged on a lower surface of the package substrate body unit 2120 or being exposed through the lower surface thereof, and a plurality of internal wirings 2135 electrically connecting the plurality of upper pads 2130 to the plurality of lower pads 2125 in the package substrate body unit 2120. The plurality of upper pads 2130 may be electrically connected to the plurality of connection structures 2400. The plurality of lower pads 2125 may be connected to the plurality of wiring patterns 2005 on the main substrate 2001 of the electronic system 2000 illustrated in FIG. 14 via a plurality of conductive connection units 2800.

Each of the plurality of semiconductor chips 2200 may include a semiconductor substrate 3010, and a first structure 3100 and a second structure 3200 which are sequentially stacked on the semiconductor substrate 3010. The first structure 3100 may include a periphery circuit region including a plurality of periphery wirings 3110. The second structure 3200 may include a common source line 3205, a gate stack 3210 on the common source line 3205, a channel structure 3220 penetrating the gate stack 3210, a bit line 3240 electrically connected to the channel structure 3220, and the gate stack 3210. The gate stack 3210 may include the plurality of word lines (WL in FIG. 13), and the plurality of conductive pad regions 112 integrally connected to the plurality of word lines WL. In addition, each of the plurality of semiconductor chips 2200 may include the plurality of contact structures CTS electrically connected to the plurality of conductive pad regions 112 of the gate stack 3210, and a plurality of conductive pad regions 112 and a plurality of metal silicide layers 118 between the plurality of conductive pad regions 112 and the plurality of contact structures CTS. Each of the plurality of conductive pad regions 112 may be connected to the contact structure CTS via the metal silicide layer 118. More detailed configurations and various modifications of the connection portions between the plurality of conductive pad regions 112, the plurality of metal silicide films 118, and the plurality of contact structures CTS may be substantially the same as those, described with reference to FIGS. 5A through 5C, and 7A through 7C, of the connection portions between the metal silicide layers 118, 118A, 118B, and 118C, the conductive pad region 112, and the contact structures CTS, CTSA, CTSB, and CTSC, respectively.

Each of the plurality of semiconductor chips 2200 may include a through wiring 3245 that is electrically connected to the plurality of periphery wirings 3110 of the first structure 3100 and extends into the second structure 3200. The through wiring 3245 may be outside the gate stack 3210. In some example embodiments, the semiconductor package 2003 may further include a through wiring penetrating the gate stack 3210. Each of the plurality of semiconductor chips 2200 may further include the I/O pad (2210 in FIG. 14) electrically connected to the plurality of periphery wirings 3110 of the first structure 3100.

FIG. 16 is a schematic cross-sectional view of a semiconductor package 2003A, according to some embodiment of the inventive concepts. FIG. 16 illustrates a configuration of a portion corresponding to the cross-section taken along line II-IP in FIG. 14.

Referring to FIG. 16, the semiconductor package 2003A may have substantially the same configuration as the semiconductor package 2003 described with reference to FIG. 15. However, the semiconductor package 2003A may include a plurality of semiconductor chips 2200A. Each of the plurality of semiconductor chips 2200A may include a semiconductor substrate 4010, a first structure 4100 on the semiconductor substrate 4010, and a second structure 4200 bonded to the first structure by the wafer bonding method on the first structure 4100.

The first structure 4100 may include a periphery circuit region including a periphery wiring 4110 and a plurality of first bonding structures 4150. The second structure 4200 may include a common source line 4205, a gate stack 4210 between the common source line 4205 and the first structure 4100, and a channel structure 4220 penetrating the gate stack 4210. The gate stack 4210 may include a plurality of word lines (WL in FIG. 13) and the plurality of conductive pad regions 112 integrally connected to the plurality of word lines. In addition, each of the plurality of semiconductor chips 2200A may include the plurality of contact structures CTS electrically connected to the plurality of conductive pad regions 112 of the gate stack 3210, and the plurality of metal silicide layers 118 between the plurality of conductive pad regions 112 and the plurality of contact structures CTS. Each of the plurality of conductive pad regions 112 may be connected to the contact structure CTS via the metal silicide layer 118. More detailed configurations and various modifications of the connection portions between the plurality of conductive pad regions 112, the plurality of metal silicide films 118, and the plurality of contact structures CTS may be substantially the same as those, described with reference to FIGS. 5A through 5C, and 7A through 7C, of the connection portions between the metal silicide layers 118, 118A, 118B, and 118C, the conductive pad region 112, and the contact structures CTS, CTSA, CTSB, and CTSC.

In addition, each of the plurality of semiconductor chips 2200A may include a plurality of second bonding structures 4250 each electrically connected to the plurality of word lines (WL in FIG. 13) of the gate stack 4210. For example, each of the plurality of second bonding structures 4250 may be connected to the channel structure 4220 and the word line (WL in FIG. 1), via a bit line 4240 electrically connected to the channel structure 4220 and the contact structure CTS electrically connected to the word line (WL in FIG. 13).

The plurality of first bonding structures 4150 of the first structure 4100 and the plurality of second bonding structures 4250 of the second structure 4200 may be in contact and bonded with each other. Portions where the plurality of first bonding structures 4150 and the plurality of second bonding structures 4250 are bonded to each other may include, for example, Cu.

The plurality of semiconductor chips 2200 illustrated in FIG. 15 and the plurality of semiconductor chips 2200A illustrated in FIG. 16 may be electrically connected to each other by the plurality of connection structures 2400 (refer to FIG. 14) in a form of a bonding wire. In some example embodiments, the plurality of semiconductor chips 2200 illustrated in FIG. 15 and the plurality of semiconductor chips 2200A illustrated in FIG. 16 may be electrically connected to each other via a connection structure including the through electrode TSV.

FIGS. 17A through 17E are cross-sectional views illustrating a manufacturing method of the semiconductor device 100 according to a process sequence, according to some embodiments of the inventive concepts. In the present example, a manufacturing method of the semiconductor device 100 illustrated in FIGS. 4 and 5A through 5C are described.

Figure 17A:
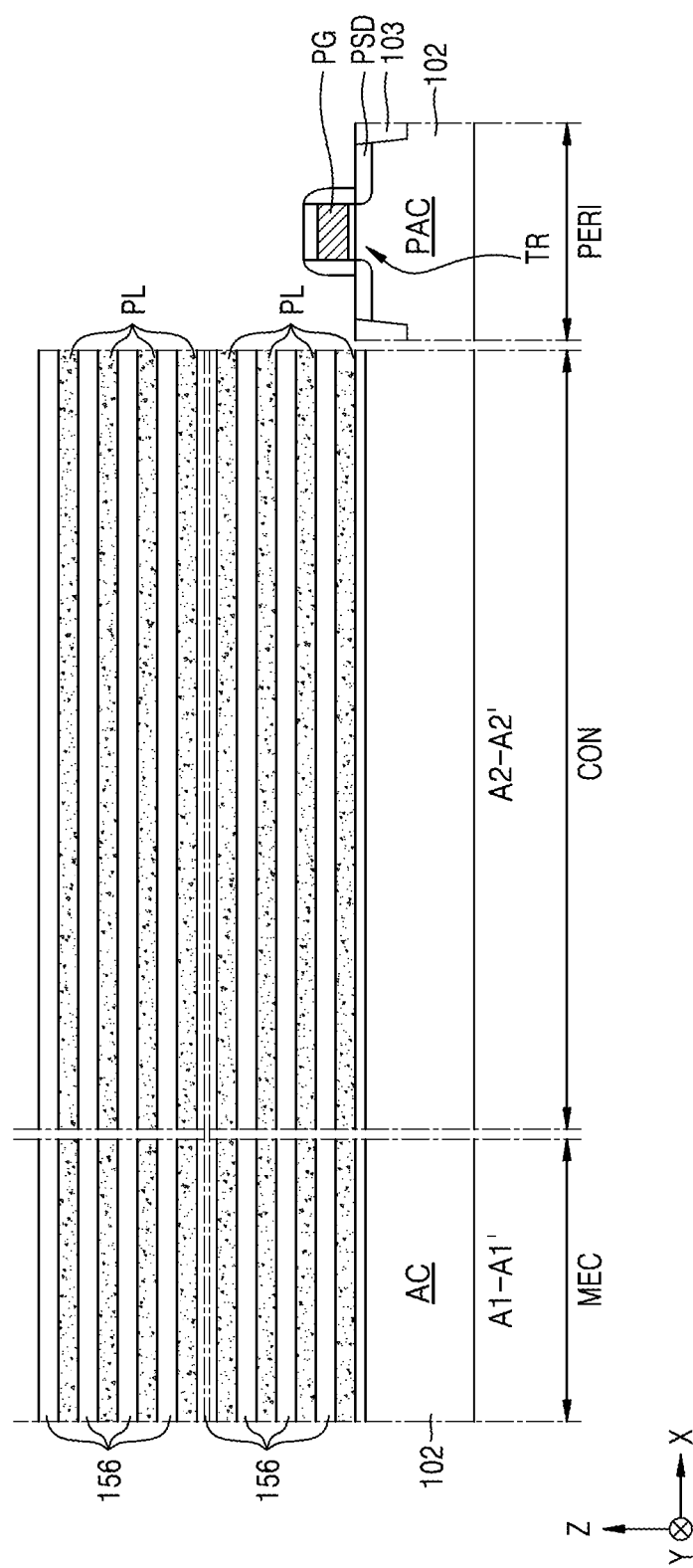

Referring to FIG. 17A, the active region AC may be defined in the memory cell region MEC of the substrate 102, and the periphery active region PAC may be defined in the periphery circuit region PERI. The periphery active region PAC may be defined by the element isolation layer 103.

A plurality of insulating layers 156 and a plurality of sacrificial layers PL may be alternately stacked one by one in the memory cell region MEC and the connection region CON of the substrate 102, and the periphery transistor TR may be formed in the periphery circuit region PERI. The plurality of sacrificial layers PL may include silicon nitride, silicon carbide, or polysilicon, as examples. Each of the plurality of sacrificial layers PL may secure a space for forming the gate stack GS in a subsequent process (refer to FIG. 17C).

Figure 17B:
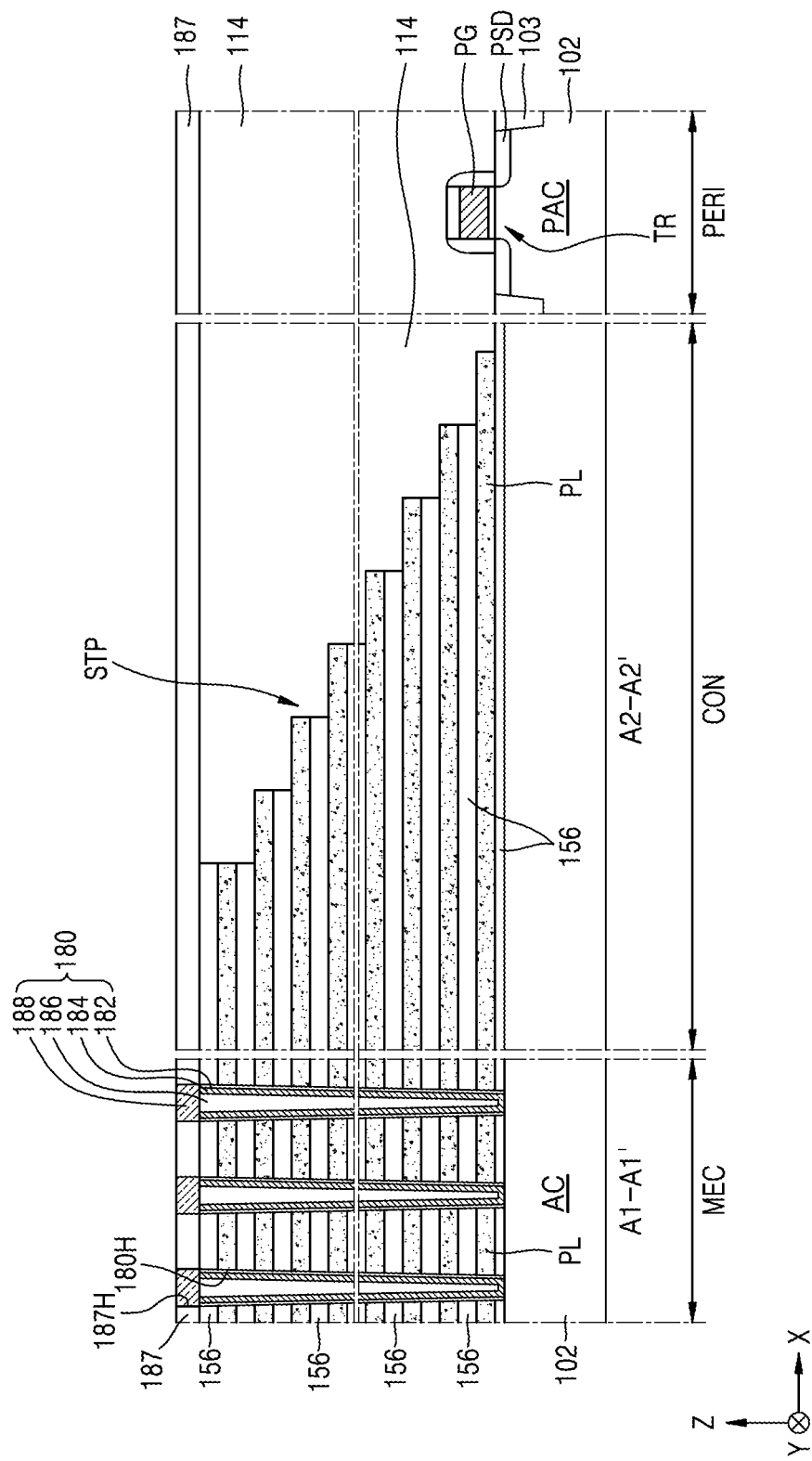

Referring to FIG. 17B, after removing a portion of each of the plurality of insulating layers 156 and the plurality of sacrificial layers PL so that the plurality of insulating layers 156 and the plurality of sacrificial layers PL form a stepped structure STP, the insulating layer 114 covering the stepped structure STP and the periphery transistor TR may be formed on the substrate 102.

Next, the plurality of lower channel holes 180H penetrating the plurality of insulating layers 156 and the plurality of sacrificial layers PL and extending in the vertical direction (Z direction) may be formed in the memory cell region MEC, and a plurality of lower channel hole buried structures may be formed by forming the gate dielectric layer 182, a channel region 184, and the buried insulating layer 186 in each of the plurality of lower channel holes 180H.

Next, the intermediate insulating layer 187 covering the plurality of lower channel hole buried structures, the stepped structure STP, and the insulating layer 114 in the memory cell region MEC, the connection region CON, and the periphery circuit region PERI may be formed, an upper surface of the plurality of lower channel hole buried structures may be exposed by forming the plurality of contact holes 187H in the intermediate insulating layer 187, and the channel structure 180 may be formed by forming the plurality of drain regions 188 in the plurality of contact holes 187H. The intermediate insulating layer 187 may have a planarized upper surface over the memory cell region MEC, the connection region CON, and the periphery circuit region PERI.

Figure 17C:
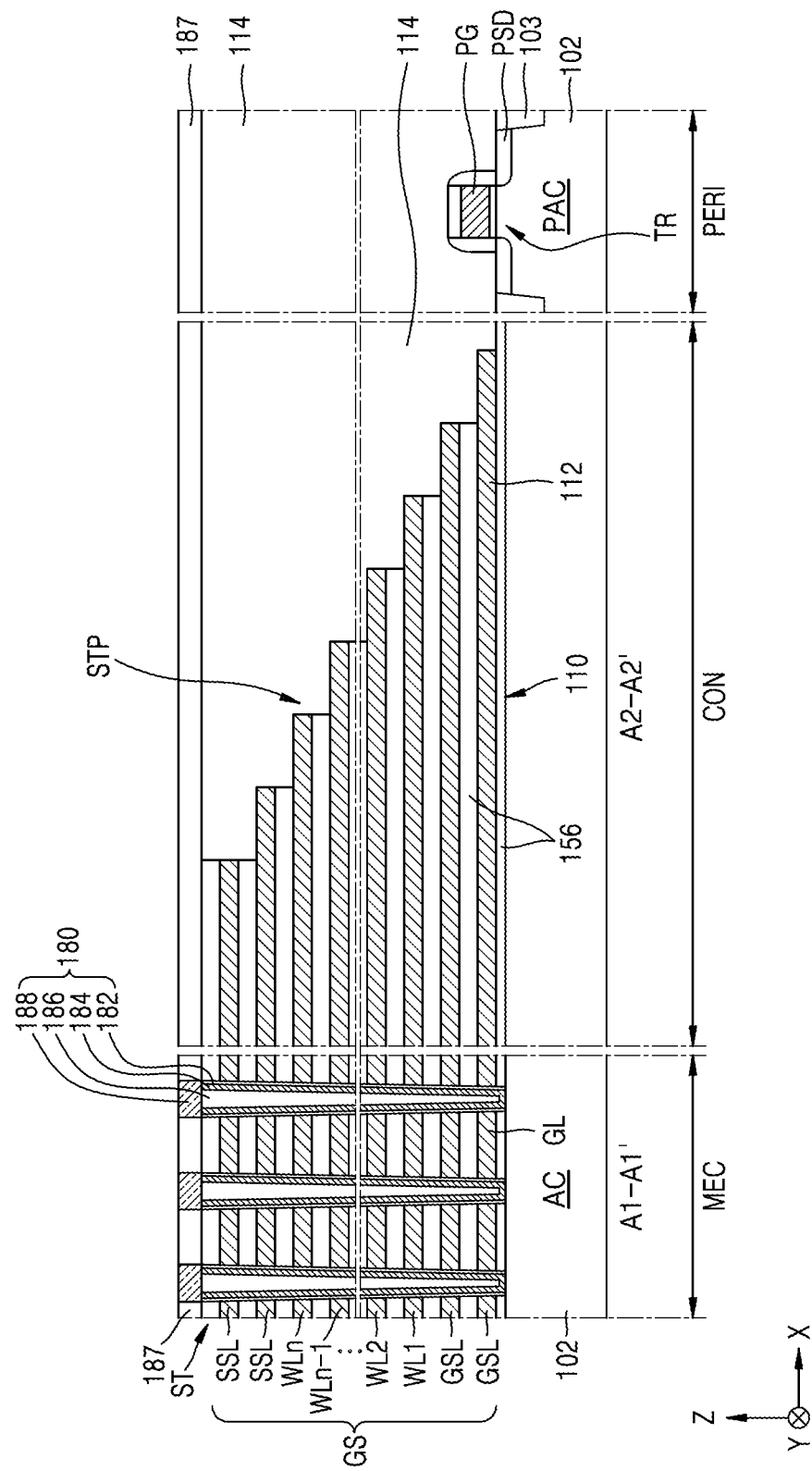

Referring to FIG. 17C, after the plurality of word line cut regions WLC penetrating the plurality of insulating layers 156 and the plurality of sacrificial layers PL (refer to FIG. 17B) and exposing the substrate 102 (refer to FIGS. 4 and 5B) is formed, the plurality of common source region 106 (refer to FIG. 5B) may be formed by implanting impurity ions into the substrate 102 through a plurality of word line cut regions WLC, and then the plurality of sacrificial layers PL (refer to FIG. 17B) may be replaced with the plurality of gate lines GL and the plurality of conductive pad regions 112. In the connection region CON, the plurality of conductive pad regions 112 may constitute the stepped connection unit 110.

In some example embodiments, after an empty space is prepared between the plurality of insulating layers 156 by selectively removing the plurality of sacrificial layers PL (refer to FIG. 17B) exposed through the plurality of word line cut region WLC to substitute the plurality of sacrificial layers PL (refer to FIG. 17B) with the plurality of lower word lines WLA, by burying a conductive material in the empty space, the plurality of gate lines GL and the plurality of conductive pad regions 112 may be formed.

Thereafter, as illustrated in FIG. 5B, in each of the plurality of word line cut regions WLC, the word line cut structure WCS may be formed by forming the insulating spacer 192 and the common source line CSL. The insulating spacer 192 may include silicon oxide, silicon nitride, SiON, SiOCN, SiCN, or a combination thereof. The common source line CSL may include a metal such as tungsten, copper, and aluminum, a conductive metal nitride such as titanium nitride and tantalum nitride, a transition metal such as titanium and tantalum, or a combination thereof. In some embodiments, a metal silicide layer (not illustrated) for reducing contact resistance may be between the common source region 106 and the common source line CSL. The metal silicide layer may include cobalt silicide, but the present disclosure is not limited thereto. In some embodiments, when a common source line (not illustrated) is buried in the substrate 102, the plurality of word line cut regions WLC may be filled with only an insulating material, and a forming process of the common source line CSL may be omitted.

Figure 17D:
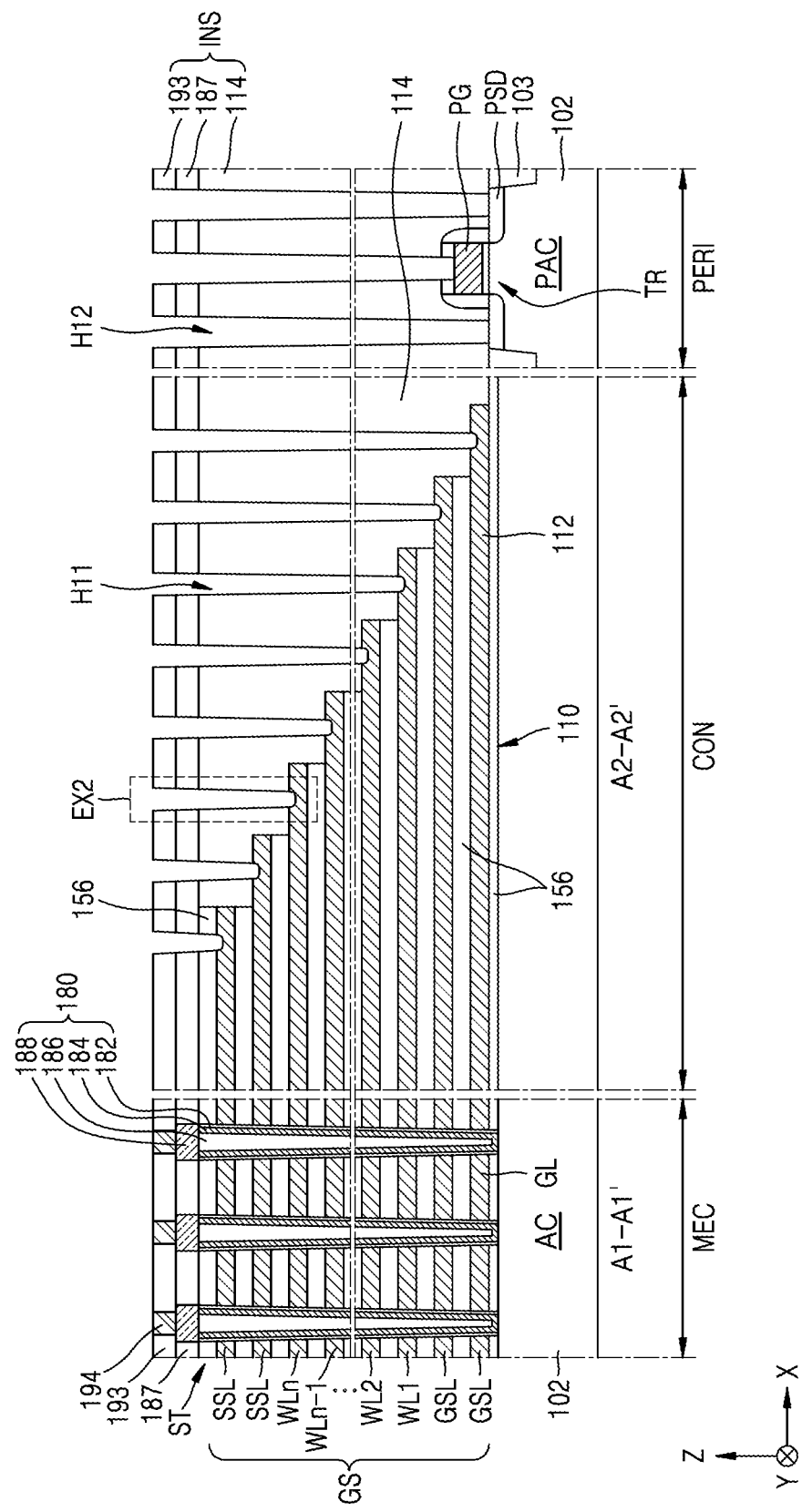

Referring to FIG. 17D, after forming the upper insulating layer 193 on the result of FIG. 17C, the plurality of bit line contact pads 194 penetrating the upper insulating layer 193 and being connected to the plurality of channel structures 180 in the memory cell region MEC may be formed. The insulating layer 114, the intermediate insulating layer 187, and the upper insulating layer 193 may constitute the insulating structure INS.

The plurality of first contact holes H11 exposing the plurality of conductive pad regions 112 in the connection region CON may be formed by anisotropically etching the insulating structure INS in the connection region CON and the periphery circuit region PERI by using a mask pattern (not illustrated) as an etching mask, and a plurality of second contact holes H12 may be formed exposing the periphery gate PG and the periphery source/drain region PSD in the periphery circuit region PERI. The plurality of first contact holes H11 and the plurality of second contact holes H12 may be simultaneously formed.

Figure 17E:
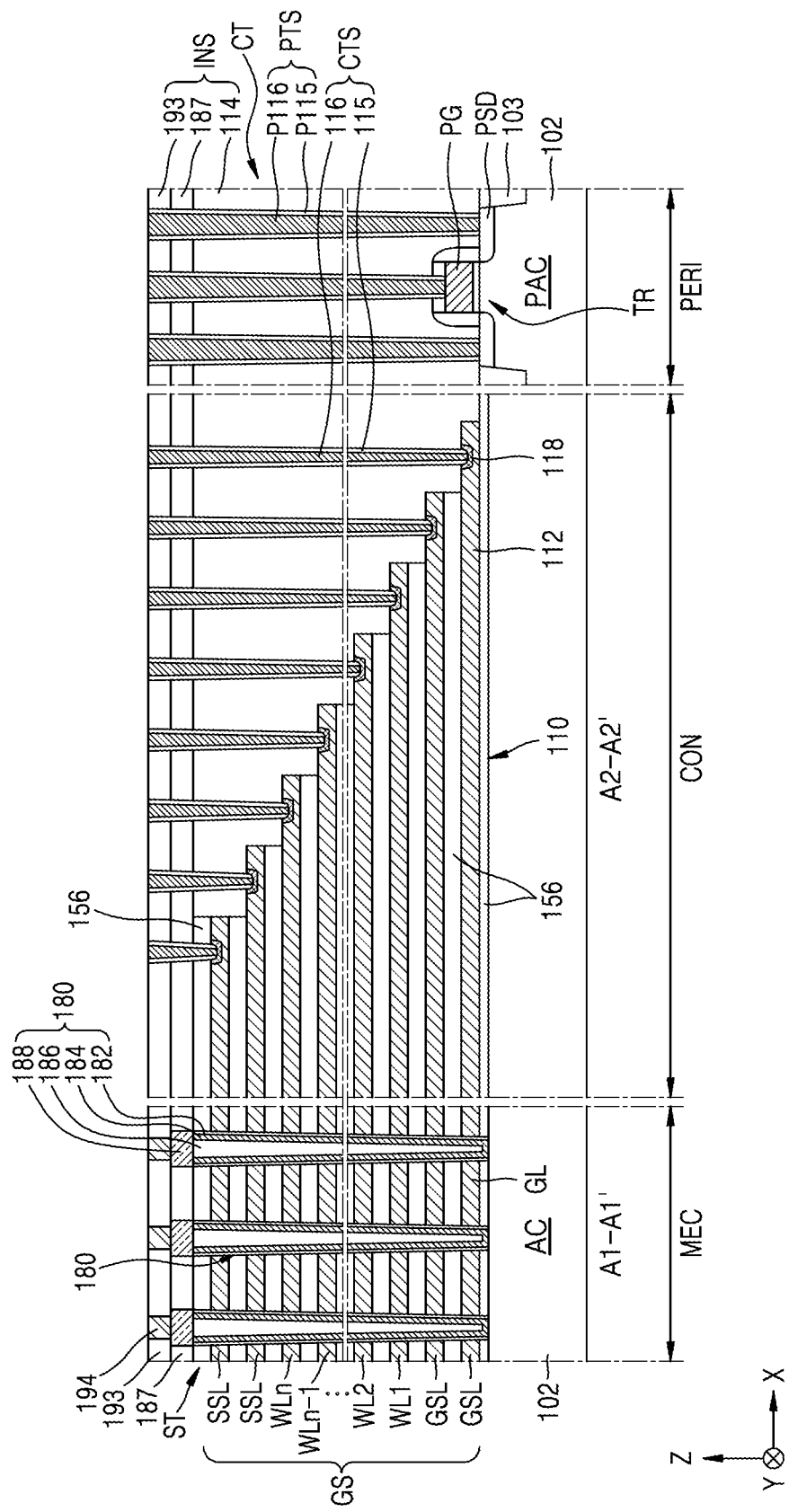

Referring to FIG. 17E, the metal silicide layer 118 may be formed on the surface of the conductive pad region 112 exposed through each of the plurality of first contact holes H11 in the connection area CON, and the contact structure CTS may be formed on the metal silicide layer 118 in each of the plurality of first contact holes H11. In addition, by sequentially forming the periphery insulating plug P115 and the periphery contact plug P116 in the plurality of second lower contact holes H12 in the periphery circuit region PERI, the periphery contact structure PTS may be formed.

FIGS. 18A through 18E are cross-sectional views illustrated according to a process sequence to describe in more detail a process of forming the metal silicide layer 118 on the surface of the conductive pad region 112 and forming the contact structure CTS on the metal silicide layer 118 in the connection region CON according to the process in FIG. 17E. In FIGS. 18A through 18E, an enlarged cross-sectional configuration of a portion corresponding to a local region indicated as EX2 in FIG. 17D is illustrated according to a process sequence.

Figure 18A:
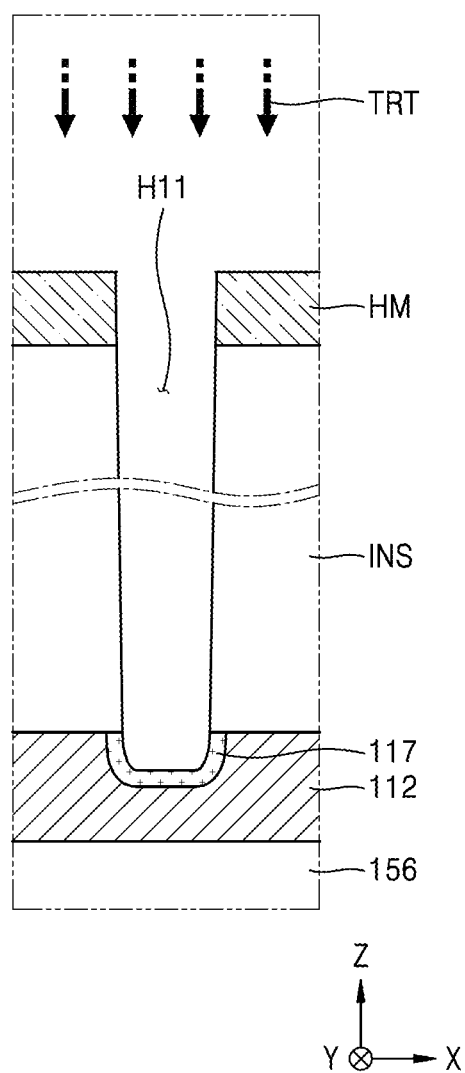

Referring to FIG. 18A, the plurality of first contact holes H11 may be formed as described with reference to FIG. 17D. A hard mask HM may be used as an etching mask to form the plurality of first contact holes H11. The hard mask HM may include a material capable of providing an etching selectivity when the insulating structure INS is etched. For example, the hard mask HM may include a silicon nitride layer, a polysilicon layer, a spin on hardmask (SOH), or a combination thereof, but is not limited thereto.

Next, by pretreating the result in which the first contact hole H11 has been formed in an atmosphere TRT including $O_2$ or oxygen plasma, a metal including layer 117 may be formed on the surface of the conductive pad region 112 exposed through the first contact hole H11.

For example, when the conductive pad region 112 includes a tungsten layer, before the first contact hole H11 is formed, the conductive pad region 112 may be in a state where a tungsten-containing gas such as $WF_6$ based gas, $WCl_6$ based gas, or the like has been outgassed from the tungsten layer constituting the conductive pad region 112. In this state, when pretreatment is performed in the atmosphere TRT including $O_2$ or oxygen plasma after forming the plurality of first contact holes H11 exposing the plurality of conductive pad regions 112 as described with reference to FIG. 17D, the metal-containing layer 117 including tungsten oxide ($WO_x$, $0<x\leq3$) may be formed on the surface of the conductive pad region 112 exposed through the first contact hole H11.

Figure 18B:
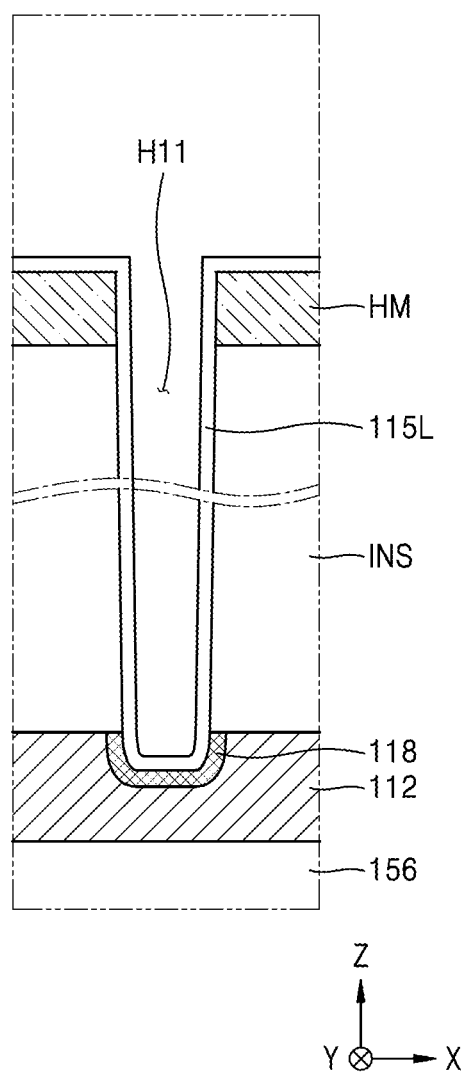

Referring to FIG. 18B, after cleaning the result of FIG. 18A by using a strip process, an insulating liner 115L that conforms to and covers the inner surface of the first contact hole H11 may be formed.

In example embodiments, the insulating liner 115L may include a silicon nitride layer, a silicon oxide layer, or a combination thereof. To form the insulating liner 115L, monochlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), or a combination thereof may be used as a silicon (Si) precursor, but the present disclosure is not limited thereto. When the insulating liner 115L includes a silicon nitride layer, $NH_3$ gas may be used as a nitride gas to form the insulating liner 115L, but the inventive concept is not limited thereto. When the insulating liner 115L includes a silicon oxide layer, $O_2$, $O_3$, $O_2$ plasma, $H_2O$, or the like may be used as an oxidizing gas, but the present disclosure is not limited thereto.

While the insulating liner 115L is formed on the result of FIG. 18A, the metal silicide layer 118 may be formed from the metal-included layer 117 illustrated in FIG. 18A. For example, while forming the insulating liner 115L on the result of FIG. 18A, tungsten oxide constituting the metal-included layer 117 illustrated in FIG. 18A and the tungsten-containing gas such as $WF_6$ based gas, $WCl_6$ based gas, or the like that remains in the conductive pad region 112 due to outgassing may react with Si precursor used in the forming process of the insulating liner 115L, and the metal silicide layer 118 including the tungsten silicide layer may be formed.

In example embodiments, the metal silicide layer 118 may include at least one element of nitrogen element (N) and oxygen (O). For example, the metal silicide layer 118 may include WSi, WSiN, WSiO, or a combination thereof. The terms "WSi", "WSiN", and "WSiO" as used in the present specification may denote a material including elements included in each term, and may not represent a stoichiometric relationship.

In forming the metal silicide layer 118, according to a thickness, a volume, and/or plan area of the conductive pad region 112, process temperature and process pressure at the time of forming the insulating liner 115L, and types of a Si precursor and a nitration gas used at the time of forming the insulating liner 115L, a depth at which the first contact hole H11 extends into the conductive pad region 112, or the like, the metal silicide layer 118 may have the configuration illustrated in FIG. 5C, the configuration of the metal silicide layers 118A, 118B, and 118C illustrated in FIGS. 7A through 7C, and various configurations modified and changed therefrom.

Figure 18C:
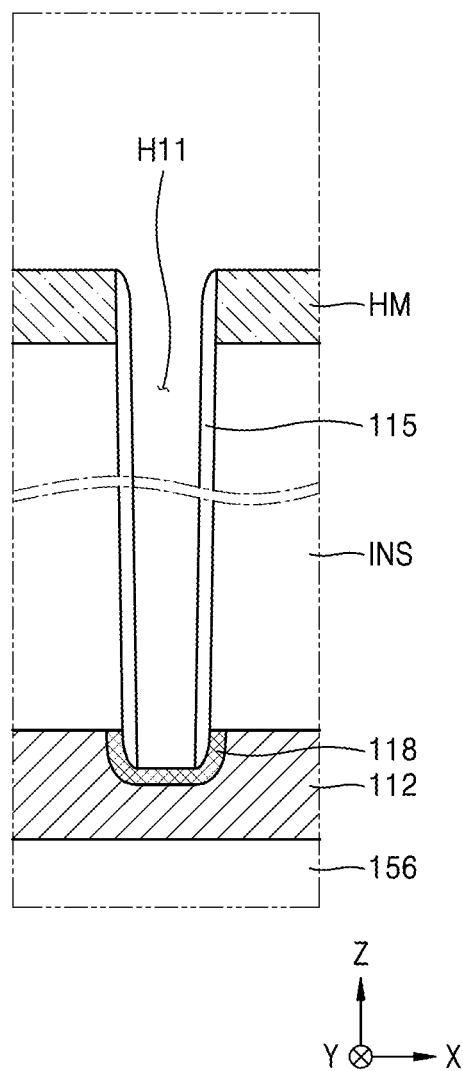

Referring to FIG. 18C, the insulating liner 115L may be etched back so that the metal silicide layer 118 is exposed through the first contact hole H11 in the result of FIG. 18B. As a result, the insulating plug 115 may remain in the first contact hole H11. The metal silicide layer 118 may be exposed through the insulating plug 115 in the first contact hole H11.

Figure 18D:
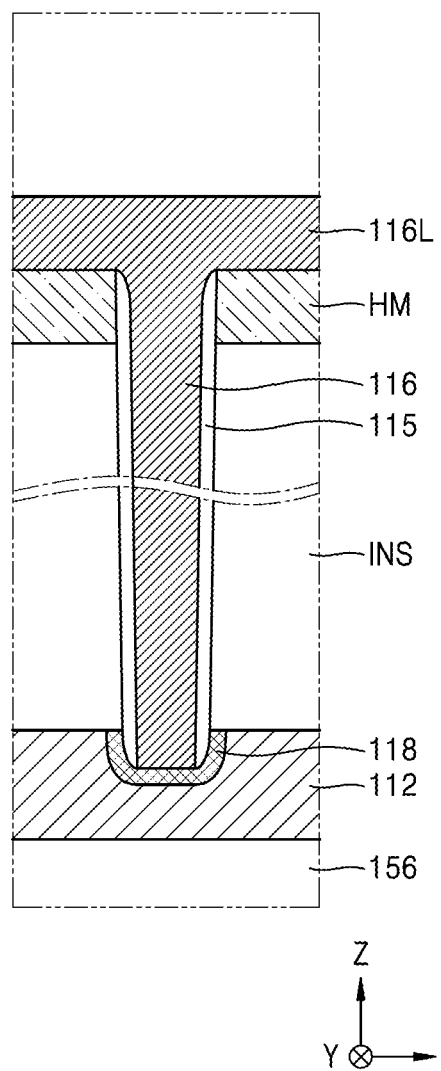

Referring to FIG. 18D, a conductive layer 116L covering an upper surface of the hard mask HM may be formed while filling the first contact hole H11 in the result of FIG. 18C. The conductive layer 116L may include tungsten, titanium, tantalum, Cu, aluminum, titanium nitride, tantalum nitride, tungsten nitride, or a combination thereof.

Figure 18E:
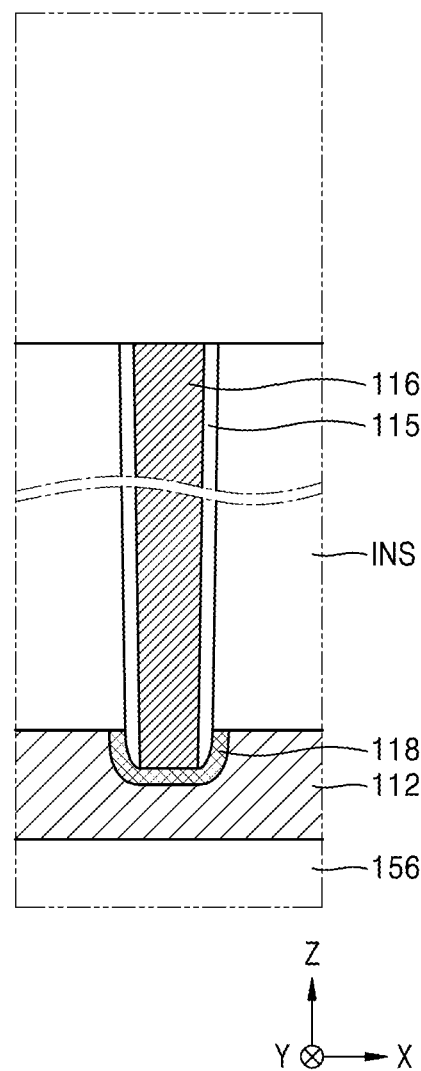

Referring to FIG. 18E, the result of FIG. 18D may be planarized so that the upper surface of the insulating structure INS is exposed, and the contact plug 116 may be formed in the first contact hole H11. The contact plug 116 may include a portion remaining in the first contact hole H11 of the conductive layer 116L.

Referring back to FIG. 17E, after forming the interlayer insulating layer 195 covering the result of FIG. 17E in the memory cell region MEC, by forming the plurality of bit lines BL, the plurality of wiring layers ML, and the plurality of periphery wiring layers PML penetrating some regions of the interlayer insulating layer 195, the semiconductor device 100 described with reference to FIGS. 4 and 5A through 5C may be manufactured.

The manufacturing method of the semiconductor device 100 described with reference to FIGS. 4 and 5A through 5C has been described with reference to FIGS. 17A through 17E and 18A through 18E. However, it will be appreciated by those of skill in the art that, by applying various modifications and changes to the descriptions above within the technical scope of the inventive concept, the semiconductor devices 200A, 200B, 200C, 300, 400, 500A, 500B, 600 may be manufactured with reference to FIGS. 7A through 12, and semiconductor devices having various structures by applying various modifications and changes thereto within the technical scope of the inventive concept may be manufactured.

While the inventive concepts have been particularly shown and described with reference to some example embodiments thereof, it will be understood that various changes in form and details may be made therein without departing from the scope of the following claims.

What is claimed is:

1. A semiconductor device comprising:
   a substrate comprising a memory cell region and a connection region;
   a plurality of gate lines vertically overlapping each other in the memory cell region, each gate line comprising a first metal;
   a stepped connection unit in the connection region comprising a plurality of conductive pad regions, each conductive pad region integrally connected to a respective gate line of the plurality of gate lines and comprising the first metal;
   a plurality of contact structures vertically overlapping the stepped connection unit, each contact structure connected to a respectively corresponding conductive pad region of the plurality of conductive pad regions and comprising a second metal; and
   at least one metal silicide layer between each of the plurality of contact structures and the respectively corresponding conductive pad regions, wherein an uppermost surface of each of the metal silicide layers is equal to or lower than an uppermost surface of the respectively corresponding conductive pad region and a bottom surface of each of the metal silicide layers is above a lower surface of the respectively corresponding conductive pad region.

2. The semiconductor device of claim 1, wherein the first metal comprises tungsten (W), and wherein the at least one metal silicide layer comprises WSi, WSiN, WSiO, or a combination thereof.

3. The semiconductor device of claim 1, wherein the at least one metal silicide layer comprises a plurality of metal silicide layers between each conductive pad region of the plurality of conductive pad regions and the respectively corresponding contact structure of the plurality of contact structures.

4. A semiconductor device comprising:
   a substrate comprising a memory cell region and a connection region;
   a gate stack comprising a first gate line integrally connected with a first conductive pad region and a second gate line integrally connected with a second conductive pad region, wherein the first gate line and the second gate line extend in a horizontal direction parallel with a main surface of the substrate in the memory cell region and the first conductive pad region and the second conductive pad region extend in the horizontal direction in the connection region, and wherein the first gate line, first conductive pad region, second gate line, and second conductive pad region each comprise a first metal;
   first and second contact structures extending in the connection region in a vertical direction, the first and second contact structures comprising a second metal; and
   a first metal silicide layer between the first conductive pad region and the first contact structure and a second metal silicide layer between the second conductive pad region and the second contact structure, the first metal silicide layer contacting the first conductive pad region and the first contact structure and the second metal silicide layer contacting the second conductive pad region and the second contact structure, wherein the first metal silicide layer has an uppermost surface equal to or lower than a vertical level of an uppermost surface of the first conductive pad region and a bottom surface that is above a lower surface of the first conductive pad region, and wherein the second metal silicide layer has an uppermost surface equal to or lower than a vertical level of an uppermost surface of the second conductive pad region and a bottom surface that is above a lower surface of the second conductive pad region.

5. The semiconductor device of claim 4, wherein the first metal is the same as the second metal.

6. The semiconductor device of claim 4, wherein the first metal and the second metal are different from each other.

7. The semiconductor device of claim 4, wherein the first metal silicide layer comprises at least one of nitrogen (N) and oxygen (O).

8. The semiconductor device of claim 4, wherein a lowermost surface of the first metal silicide layer is spaced apart from a lower surface of the first conductive pad region.

9. The semiconductor device of claim 4, wherein the gate stack comprises a plurality of gate lines in the memory cell region that overlap each other in the vertical direction, and a plurality of conductive pad regions in the connection region each integrally connected to a respective gate line of the plurality of gate lines, the plurality of conductive pad regions overlapping each other in the vertical direction, and
   wherein the first conductive pad region is one of the plurality of conductive pad regions, and
   wherein a vertical distance from the first conductive pad region to the substrate is less than a vertical distance from an uppermost conductive pad region of the plurality of conductive pad regions to the substrate.

10. The semiconductor device of claim 4, further comprising:
    a periphery circuit region that faces the gate stack with the substrate therebetween and comprising a periphery circuit wiring layer comprising a third metal,
    a periphery contact structure that penetrates the substrate extends vertically to the periphery circuit wiring layer, and comprises a fourth metal, and
    a periphery metal silicide layer between the periphery circuit wiring layer and the periphery contact structure that contacts the periphery circuit wiring layer and the periphery contact structure.

11. A semiconductor device, comprising:
    a device substrate comprising a memory cell region and a connection region;
    a gate stack comprising first and second gate lines integrally connected with respective first and second conductive pad regions, each gate line extending in a horizontal direction parallel with a main surface of the device substrate in the memory cell region and each conductive pad region extending in the connection region in the horizontal direction, and the gate lines and conductive pad regions comprising a first metal;
    first and second contact structures vertically extending in the connection region and comprising a second metal;
    a first metal silicide layer between the first conductive pad region and the first contact structure, wherein an uppermost surface of the first metal silicide layer is coplanar with an uppermost surface of the first conductive pad region and a bottommost surface of the first metal silicide layer is above a lower surface of the first conductive pad region;
    a second metal silicide layer between the second conductive pad region and the second contact structure, wherein an uppermost surface of the second metal silicide layer is coplanar with an uppermost surface of the second conductive pad region and a bottommost surface of the second metal silicide layer is above a lower surface of the second conductive pad region; and a periphery circuit region spaced apart from the gate stack; and a periphery contact structure vertically extending in parallel to the first contact structure and connected to the periphery circuit region and comprising the second metal.

12. The semiconductor device of claim 11, wherein the memory cell region and a connection region are on a first side of the device substrate, and the periphery circuit region that is spaced apart from the gate stack is on a second side of the device substrate.

* * * * *